United States Patent
Kinoshita et al.

(10) Patent No.: US 12,446,282 B2
(45) Date of Patent: Oct. 14, 2025

(54) CONTROL SYSTEM AND CONTROL METHOD FOR DUAL-GATE BIDIRECTIONAL SWITCH

(71) Applicant: Panasonic Intellectual Property Management Co., Ltd., Osaka (JP)

(72) Inventors: Yusuke Kinoshita, Kyoto (JP); Masanori Nomura, Osaka (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 447 days.

(21) Appl. No.: 18/001,864

(22) PCT Filed: Apr. 13, 2021

(86) PCT No.: PCT/JP2021/015260
§ 371 (c)(1),
(2) Date: Dec. 14, 2022

(87) PCT Pub. No.: WO2022/009492
PCT Pub. Date: Jan. 13, 2022

(65) Prior Publication Data
US 2023/0231018 A1 Jul. 20, 2023

(30) Foreign Application Priority Data
Jul. 7, 2020 (JP) ................. 2020-117403

(51) Int. Cl.
*H10D 62/85* (2025.01)
*H10D 30/47* (2025.01)

(52) U.S. Cl.
CPC ..... *H10D 62/8503* (2025.01); *H10D 30/4755* (2025.01)

(58) Field of Classification Search
CPC .................................................. H10D 62/8503
(Continued)

(56) References Cited

U.S. PATENT DOCUMENTS

| | | | |
|---|---|---|---|
| 2010/0283515 A1* | 11/2010 | Kelley | H03K 17/04123 327/109 |
| 2011/0273207 A1* | 11/2011 | Coleman | H03K 17/04123 327/109 |

(Continued)

FOREIGN PATENT DOCUMENTS

| | | |
|---|---|---|
| JP | 2009-239214 | 10/2009 |
| JP | 2010-166301 | 7/2010 |

(Continued)

OTHER PUBLICATIONS

International Search Report of PCT application No. PCT/JP2021/015260 dated Jun. 29, 2021.

*Primary Examiner* — Tomi Skibinski
(74) *Attorney, Agent, or Firm* — Rimon P.C.

(57) ABSTRACT

Current collapse of a normally-on type dual-gate bidirectional switch is suppressed. Dual-gate bidirectional switch includes first gate, first source, second gate, and second source. Control system includes first gate drive circuit, second gate drive circuit, and controller. Controller controls first gate drive circuit and second gate drive circuit. At the time of turning on dual-gate bidirectional switch and when the potential of first source is lower than the potential of second source, controller applies a first positive voltage for a first period between first gate and first source from first gate drive circuit, and applies a voltage smaller than the first positive voltage after the first period has elapsed.

16 Claims, 22 Drawing Sheets

(58) Field of Classification Search
USPC .................................................. 327/108–112
See application file for complete search history.

(56) References Cited

U.S. PATENT DOCUMENTS

| | | |
|---|---|---|
| 2016/0261266 A1 | 9/2016 | Kampl et al. |
| 2019/0006499 A1* | 1/2019 | Kinoshita .............. H10D 84/05 |
| 2021/0134963 A1 | 5/2021 | Nomura et al. |
| 2021/0367499 A1 | 11/2021 | Nosaka et al. |

FOREIGN PATENT DOCUMENTS

| | | | |
|---|---|---|---|
| JP | 2010166301 A | * | 7/2010 |
| JP | 2012-527178 | | 11/2012 |
| JP | 2013-530625 | | 7/2013 |
| JP | 2015-050864 | | 3/2015 |
| JP | 2018-196026 | | 12/2018 |
| JP | 2020-068629 | | 4/2020 |
| WO | 2017/159559 | | 9/2017 |
| WO | 2020/004021 | | 1/2020 |

* cited by examiner

CONTROL SYSTEM AND CONTROL METHOD FOR DUAL-GATE BIDIRECTIONAL SWITCH

TECHNICAL FIELD

The present disclosure relates to a control system, a switch system, and a control method for a dual-gate bidirectional switch, and more particularly to a control system for a dual-gate bidirectional switch or a unidirectional switch, a switch system including the control system, and a control method for a dual-gate bidirectional switch.

BACKGROUND ART

A semiconductor device using a nitride semiconductor is conventionally known to have a problem that conduction resistance called current collapse increases when a switch is turned on. In addition, a bidirectional switching element that can suppress the current collapse is known (PTL 1).

CITATION LIST

Patent Literature

PTL 1: WO 2020/004021 A

SUMMARY OF THE INVENTION

The bidirectional switching element disclosed in Patent Literature 1 is a normally-off transistor, and Patent Literature 1 does not describe suppression of the current collapse in a normally-on dual-gate bidirectional switch.

An object of the present disclosure is to provide a control system for suppressing the current collapse of a switch constituted of a normally-on nitride semiconductor, and a control method for a dual-gate bidirectional switch.

The control system according to one aspect of the present disclosure is a control system for a normally-on dual-gate bidirectional switch. The dual-gate bidirectional switch includes a first gate, a first source corresponding to the first gate, a second gate, and a second source corresponding to the second gate. A control system includes a first gate drive circuit, a second gate drive circuit, and a controller. The first gate drive circuit is connected between the first gate and the first source. The second gate drive circuit is connected between the second gate and the second source. The controller controls the first gate drive circuit and the second gate drive circuit. At the time of turning on the dual-gate bidirectional switch, when the potential of the first source is lower than the potential of the second source, the controller applies a first positive voltage for a first period between the first gate and the first source from the first gate drive circuit, and applies a voltage smaller than the first positive voltage after the first period has elapsed.

In a control method for a dual-gate bidirectional switch according to another aspect of the present disclosure, the dual-gate bidirectional switch is a normally-on dual-gate bidirectional switch having a first gate, a first source corresponding to the first gate, a second gate, and a second source corresponding to the second gate. In the control method for the dual-gate bidirectional switch, at the time of turning on the dual-gate bidirectional switch, when the potential of the first source is lower than the potential of the second source, a first positive voltage is applied for a first period between the first gate and the first source, and a voltage smaller than the first positive voltage is applied after the first period has elapsed.

A control system according to another aspect of the present disclosure is a control system for a normally-on single-gate field effect transistor having a gate, a source, and a drain. The field effect transistor includes, for example, a substrate, a first nitride semiconductor layer, a second nitride semiconductor layer, a source electrode, a gate electrode, a drain electrode, and a p-type layer. The first nitride semiconductor layer is disposed on the substrate. The second nitride semiconductor layer is disposed on the first nitride semiconductor layer. In addition, the second nitride semiconductor layer has a larger bandgap than the first nitride semiconductor layer. The source electrode, the gate electrode, and the drain electrode are disposed on the second nitride semiconductor layer. Further, the p-type layer is interposed between the gate electrode and the second nitride semiconductor layer. The gate includes the gate electrode and the p-type layer. The source includes the source electrode, and the drain includes the drain electrode. The control system includes a gate drive circuit and a controller. The gate drive circuit is connected between the gate and the source. The controller controls the gate drive circuit. Further, at the time of turning on the field effect transistor, when the potential of the source is lower than the potential of the drain, the controller applies a first positive voltage for a first period between the gate and the source from the gate drive circuit, and applies a voltage smaller than the first positive voltage after the first period has elapsed.

The control system and the control method for the dual-gate bidirectional switch of the present disclosure can suppress the current collapse. In addition, the control system of the present disclosure can suppress the current collapse of the unidirectional switch constituted of the normally-on nitride semiconductor.

DESCRIPTION OF EMBODIMENT (Exemplary Embodiment)

Figure 1:
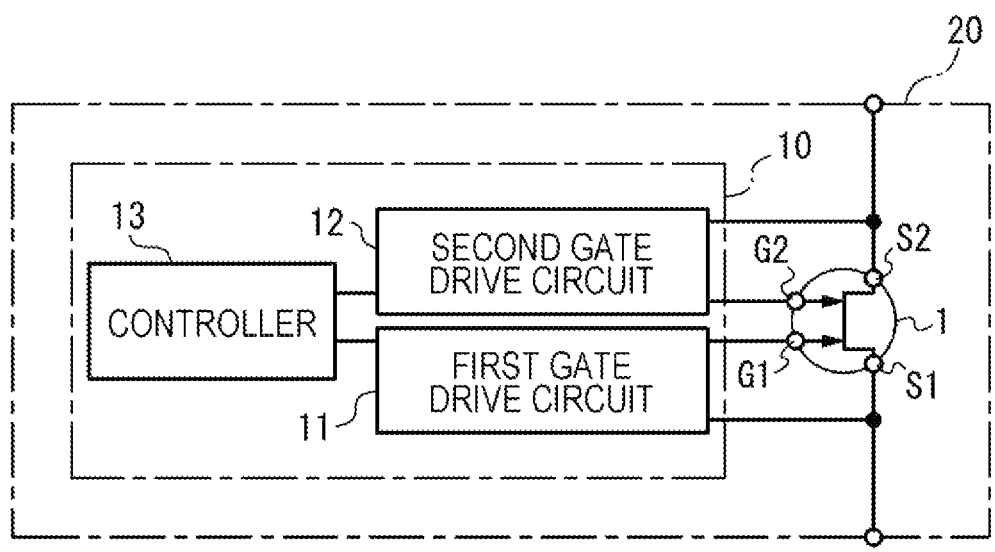
FIG. 1 is a circuit diagram of a switch system including a control system according to an exemplary embodiment.

Hereinafter, control system 10 according to the exemplary embodiment and switch system 20 including the same are described with reference to FIG. 1. FIG. 1 is a circuit diagram of switch system 20 including control system 10 according to the exemplary embodiment.

(1) Outline

Control system 10 is a control system for normally-on dual-gate bidirectional switch 1. Dual-gate bidirectional switch 1 includes first gate G1, first source S1 corresponding to first gate G1, second gate G2, and second source S2 corresponding to second gate G2. For example, a load circuit including a series circuit of a load and a power supply is connected between first source S1 and second source S2 of dual-gate bidirectional switch 1. The power supply is, for example, an AC power supply.

Control system 10 includes first gate drive circuit 11, second gate drive circuit 12, and controller 13. First gate drive circuit 11 is connected between first gate G1 and first source S1. Second gate drive circuit 12 is connected between second gate G2 and second source S2. Controller 13 controls first gate drive circuit 11 and second gate drive circuit 12.

Switch system 20 includes control system 10 and normally-on dual-gate bidirectional switch 1.

Figure 3:
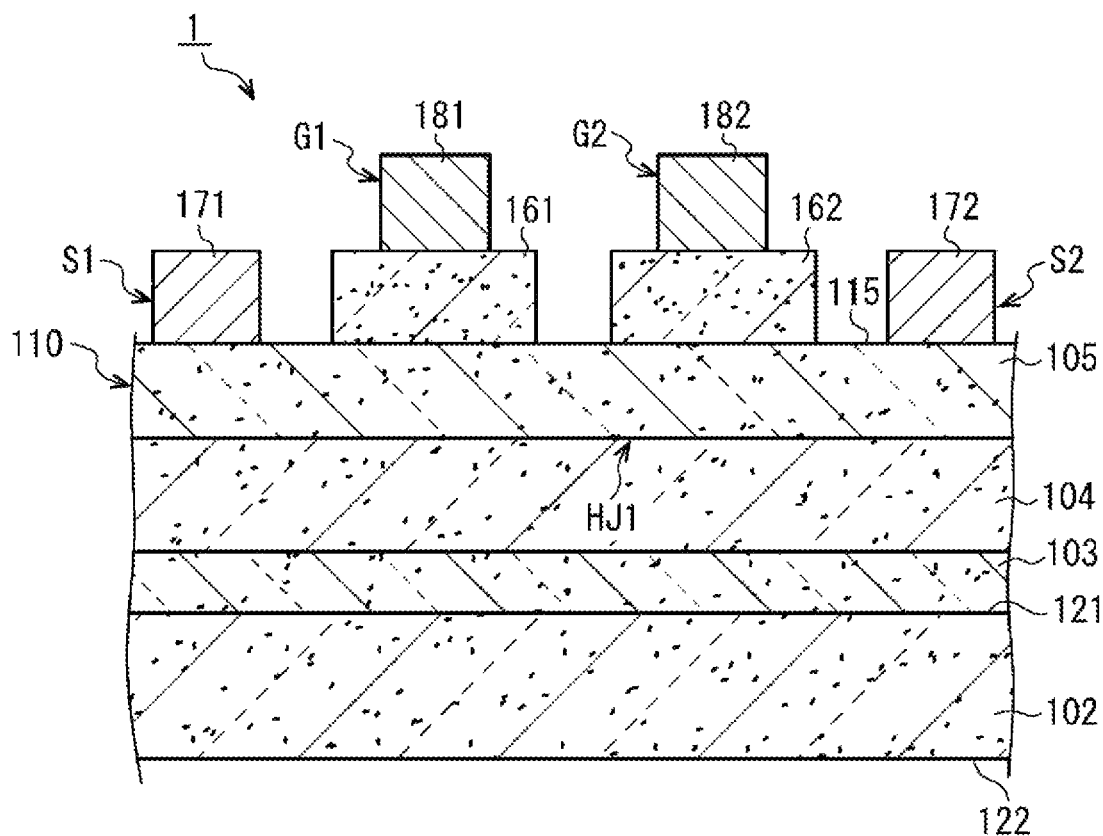
FIG. 3 is a sectional view of a dual-gate bidirectional switch controlled by the above control system.

(2) Each Constituent Element of Switch System (2.1) Dual-Gate Bidirectional Switch Dual-gate bidirectional switch 1 is a one-chip semiconductor switching element. As shown by the sectional view in FIG. 3, Dual-gate bidirectional switch 1 includes, for example, substrate 102, first nitride semiconductor layer 104, second nitride semiconductor layer 105, first source electrode 171, first gate electrode 181, second gate electrode 182, second source electrode 172, first p-type layer 161, and second p-type layer 162.

First gate G1 in dual-gate bidirectional switch 1 includes first gate electrode 181 and first p-type layer 161. Second gate G2 in dual-gate bidirectional switch 1 includes second gate electrode 182 and second p-type layer 162. Dual-gate bidirectional switch 1 is a dual-gate GaN-based gate injection transistor (GIT). First nitride semiconductor layer 104 is, for example, a GaN layer. Second nitride semiconductor layer 105 is, for example, an AlGaN layer. First p-type layer 161 is, for example, a p-type AlGaN layer. Second p-type layer 162 is, for example, a p-type AlGaN layer.

First nitride semiconductor layer 104 is disposed on substrate 102. Second nitride semiconductor layer 105 is disposed on first nitride semiconductor layer 104. Second nitride semiconductor layer 105 has a larger bandgap than first nitride semiconductor layer 104. First source electrode 171 is disposed on second nitride semiconductor layer 105. First gate electrode 181 is disposed on second nitride semiconductor layer 105 and is separated from first source electrode 171. Second gate electrode 182 is disposed on second nitride semiconductor layer 105, and is separated from first gate electrode 181 in the direction opposite to first source electrode 171 as viewed from first gate electrode 181. Second source electrode 172 is disposed on second nitride semiconductor layer 105, and is separated from second gate electrode 182 in the direction opposite to first gate electrode 181 as viewed from second gate electrode 182. First p-type layer 161 is interposed between first gate electrode 181 and second nitride semiconductor layer 105. Second p-type layer 162 is interposed between second gate electrode 182 and second nitride semiconductor layer 105. In dual-gate bidirectional switch 1, laminate 110 including first nitride semiconductor layer 104, second nitride semiconductor layer 105, first p-type layer 161, and second p-type layer 162 is disposed on substrate 102.

Substrate 102 is, for example, a silicon substrate. Substrate 102 has first principal surface 121 and second principal surface 122 opposite to first principal surface 121. In dual-gate bidirectional switch 1, laminate 110 is disposed on first principal surface 121 of substrate 102.

First nitride semiconductor layer 104 is disposed on substrate 102 with buffer layer 103 interposed therebetween. Here, laminate 110 described above includes buffer layer 103. In laminate 110, buffer layer 103, first nitride semiconductor layer 104, and second nitride semiconductor layer 105 are aligned in this order from the substrate 102. Laminate 110 further includes first p-type layer 161 and second p-type layer 162 disposed on second nitride semiconductor layer 105. Buffer layer 103 is, for example, an undoped GaN layer. The GaN layer constituting first nitride semiconductor layer 104 is, for example, an undoped GaN layer. The AlGaN layer constituting second nitride semiconductor layer 105 is, for example, an undoped AlGaN layer. Each of buffer layer 103, first nitride semiconductor layer 104, and second nitride semiconductor layer 105 may contain impurities such as Mg, H, Si, C, and O inevitably mixed during growth by metal organic vapor phase epitaxy (MOVPE) or the like.

First p-type layer 161 and second p-type layer 162 cover only a part of surface 115 of second nitride semiconductor layer 105. Therefore, surface 115 of second nitride semiconductor layer 105 includes a region covered with first p-type layer 161 and second p-type layer 162 and a region not covered with first p-type layer 161 and second p-type layer 162. First p-type layer 161 and second p-type layer 162 are separated from each other.

In dual-gate bidirectional switch 1, second nitride semiconductor layer 105 constitutes heterojunction HJ1 together with first nitride semiconductor layer 104. In first nitride semiconductor layer 104, a two-dimensional electron gas is generated in the vicinity of heterojunction HJ1. A region containing the two-dimensional electron gas (hereinafter, also referred to as a "two-dimensional electron gas layer") can function as an n-channel layer (electron conduction layer). In dual-gate bidirectional switch 1, first p-type layer 161, second nitride semiconductor layer 105, and the n-channel layer constitute a first pin diode structure. Also in dual-gate bidirectional switch 1, second p-type layer 162, second nitride semiconductor layer 105, and the n-channel layer constitute a second pin diode structure.

First source electrode 171 and second source electrode 172 are respectively disposed in regions not covered with first p-type layer 161 and second p-type layer 162 on surface 115 of second nitride semiconductor layer 105. First source electrode 171 and second source electrode 172 are separated from each other. First source electrode 171 and second source electrode 172 are electrically connected to heterojunction HJ1. Here, "being electrically connected" means being in ohmic contact. Each of first source electrode 171 and second source electrode 172 contains, for example, Ti and Al.

First gate electrode 181 is disposed on second nitride semiconductor layer 105 with first p-type layer 161 interposed therebetween. Second gate electrode 182 is disposed on second nitride semiconductor layer 105 with second p-type layer 162 interposed therebetween. A distance between first gate electrode 181 and second gate electrode 182 is longer than a distance between first p-type layer 161 and second p-type layer 162. Each of first gate electrode 181 and second gate electrode 182 is separated from a corresponding one of first source electrode 171 and second source electrode 172 in the direction along surface 115 of second nitride semiconductor layer 105. Each of first gate electrode 181 and second gate electrode 182 is, for example, in ohmic contact with a corresponding one of first p-type layer 161 and second p-type layer 162. Each of first gate electrode 181 and second gate electrode 182 contains, for example, Pd and Au.

In dual-gate bidirectional switch 1, first source electrode 171, first gate electrode 181, second gate electrode 182, and second source electrode 172 are aligned in this order in one direction along surface 115 of second nitride semiconductor layer 105. First source electrode 171, first gate electrode 181, second gate electrode 182, and second source electrode 172 are separated from each other in the one direction.

Hereinafter, for convenience of description, a state where a voltage less than first threshold voltage Vth (for example, −10 V) is applied between first gate G1 and first source S1 with reference to first source S1 is referred to as first gate G1 being in an OFF state. A state where a voltage more than or equal to the first threshold voltage (including 0 V) is applied between first gate G1 and first source S1 with reference to first source S1 is referred to as first gate G1 being in an ON state. Further, a state where a voltage less than second threshold voltage Vth2 (for example, −10 V) is applied between second gate G2 and second source S2 with reference to second source S2 is referred to as second gate G2 being in the OFF state. A state where a voltage more than or equal to the second threshold voltage (including 0 V) is applied between second gate G2 and second source S2 with reference to second source S2 is referred to as second gate G2 being in the ON state.

Because dual-gate bidirectional switch 1 is a normally-on bidirectional switch, first gate G1 is in the ON state even when the voltage between first gate G1 and first source S1 is 0 V, and second gate G2 is in the ON state even when the voltage between second gate G2 and second source S2 is 0 V.

Dual-gate bidirectional switch 1 can switch between a bidirectional ON state, a bidirectional OFF state, a first diode state, and a second diode state according to a combination of first gate voltage $V_{G1S1}$ and second gate voltage $V_{G2S2}$ respectively provided to first gate G1 and second gate G2. First gate voltage $V_{G1S1}$ is a voltage applied between first gate G1 and first source S1. Second gate voltage $V_{G2S2}$ is a voltage applied between second gate G2 and second source S2. The bidirectional ON state is a state where a bidirectional (first direction A1 and second direction A2 opposite to first direction A1) current passes. The bidirectional OFF state is a state where the bidirectional current is blocked. The first diode state is a state where only a current in first direction A1 passes. The second diode state is a state where a current in second direction A2 passes.

In semiconductor switching element 2A, the bidirectional ON state is established when first gate G1 is in the ON state and second gate G2 is in the ON state. In semiconductor switching element 2A, the bidirectional OFF state is established when first gate G1 is in the OFF state and second gate G2 is in the OFF state. In semiconductor switching element 2A, the first diode state is established when first gate G1 is in the OFF state and second gate G2 is in the ON state. In semiconductor switching element 2A, the second diode state is established when first gate G1 is in the ON state and second gate G2 is in the OFF state.

Figure 4:
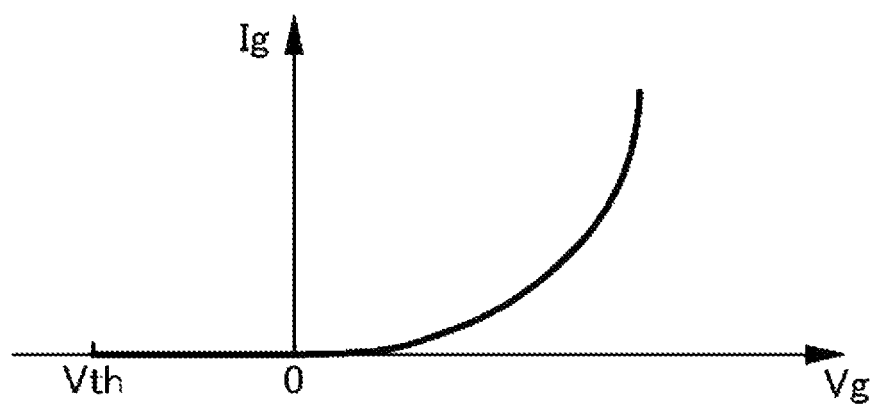
FIG. 4 is a gate voltage-gate current characteristic diagram of the dual-gate bidirectional switch controlled by the above control system.

For example, when a gate voltage applied between agate (e.g., first gate G1) and a source (e.g., first source S1) is denoted by Vg and a gate current flowing through the gate is denoted by Ig, dual-gate bidirectional switch 1 constituted by a dual-gate GaN-based gate injection transistor (GIT) has voltage-current characteristics as shown in FIG. 4. Even when gate voltage Vg is 0 V, the gate is in the ON state, but gate current Ig does not flow. When gate voltage Vg becomes a positive voltage, gate current Ig increases as gate voltage Vg increases. Even when gate voltage Vg is a negative voltage, the gate is in the ON state when gate voltage Vg is larger than threshold voltage Vth. The gate is in the OFF state when gate voltage Vg is less than threshold voltage Vth.

(2.2) Control System

Control system 10 according to the exemplary embodiment includes first gate drive circuit 11, second gate drive circuit 12, and controller 13 as shown in FIG. 1.

(2.2.1) First Gate Drive Circuit

First gate drive circuit 11 is connected between first gate G1 and first source S1.

Figure 2A:
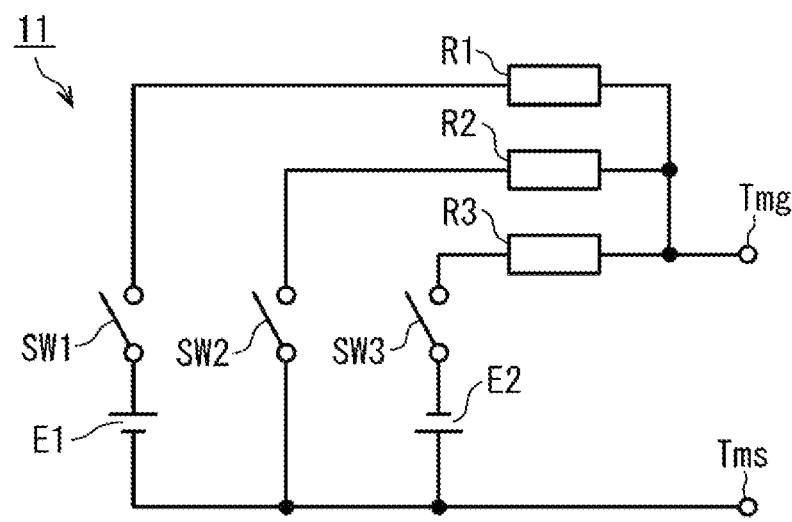
FIG. 2A is a circuit diagram of a first gate drive circuit in the above control system.

For example, as shown in FIG. 2A, first gate drive circuit 11 includes a series circuit including positive power supply E1 and first switch SW1, second switch SW2, and a series circuit including negative power supply E2 and third switch SW3. The series circuit including positive power supply E1 and first switch SW1 is connected between first gate G1 and first source S1. Second switch SW2 is connected between first gate G1 and first source S1. The series circuit including negative power supply E2 and third switch SW3 is connected between first gate G1 and first source S1.

First gate drive circuit 11 includes a pair of output terminals Tmg and Tms, and between the pair of output terminals Tmg and Tms, includes a parallel circuit constituted of a series circuit including positive power supply E1 and first switch SW1, second switch SW2, and a series circuit including negative power supply E2 and third switch SW3.

Positive power supply E1 included in first gate drive circuit 11 is a DC power supply, and a positive electrode thereof is connected to first gate G1 and a negative electrode thereof is connected to first source S1. As a result, first gate drive circuit 11 can apply a positive bias voltage (first positive voltage VP1) with first gate G1 on the higher potential than the potential of first source S1 between first gate G1 and first source S1 of dual-gate bidirectional switch 1. In first gate drive circuit 11, the positive electrode of the DC power supply constituting positive power supply E1 is connected to first gate G1 via first switch SW1 and first resistor (gate resistor) R1. In first gate drive circuit 11, output terminal Tmg connected to the positive electrode of positive power supply E1 is connected to first gate G1, and output terminal Tms connected to the negative electrode of positive power supply E1 is connected to first source S1.

Second switch SW2 included in first gate drive circuit 11 is connected to first gate G1 via second resistor (second gate resistor) R2.

Negative power supply E2 included in first gate drive circuit 11 is a DC power supply, and a negative electrode thereof is connected to first gate G1 and a positive electrode thereof is connected to first source S1. As a result, first gate drive circuit 11 can apply a negative bias voltage (first negative voltage VN1 smaller than first threshold voltage Vth1) with first gate G1 on the lower potential than the potential of first source S1 between first gate G1 and first source S1 of dual-gate bidirectional switch 1. In first gate drive circuit 11, the negative electrode of the DC power supply constituting negative power supply E2 is connected to first gate G1 via third switch SW3 and third resistor (third gate resistor) R3.

Each of first switch SW1, second switch SW2, and third switch SW3 included in first gate drive circuit 11 is, for example, a normally-off semiconductor switch.

(2.2.2) Second Gate Drive Circuit

Second gate drive circuit 12 is connected between second gate G2 and second source S2.

Figure 2B:
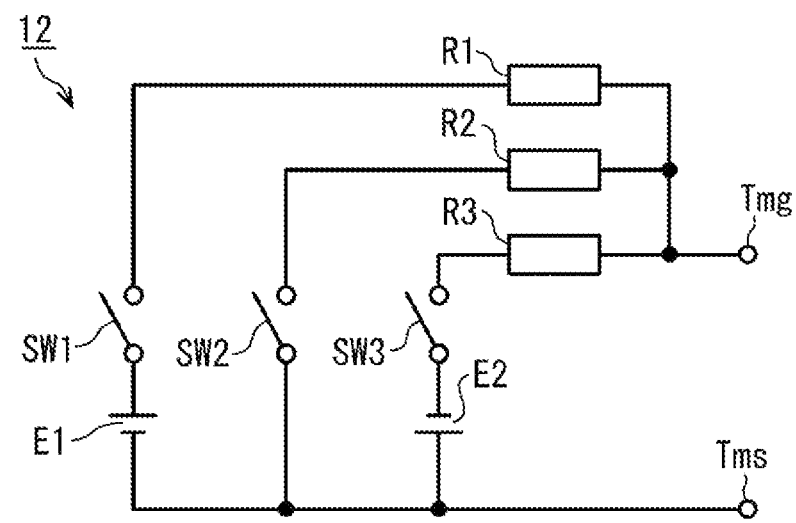
FIG. 2B is a circuit diagram of a second gate drive circuit in the above control system.

For example, as shown in FIG. 2B, second gate drive circuit 12 has the same circuit configuration as first gate drive circuit 11. In second gate drive circuit 12, a series circuit including positive power supply E1 and first switch SW1 is connected between second gate G2 and second source S2. Second switch SW2 is connected between second gate G2 and second source S2. The series circuit including negative power supply E2 and third switch SW3 is connected between second gate G2 and second source S2.

Second gate drive circuit 12 includes a pair of output terminals Tmg and Tms, and between the pair of output terminals Tmg and Tms, includes a parallel circuit constituted of a series circuit including positive power supply E1 and first switch SW1, second switch SW2, and a series circuit including negative power supply E2 and third switch SW3.

Positive power supply E1 included in second gate drive circuit 12 is a DC power supply, and a positive electrode thereof is connected to second gate G2 and a negative electrode thereof is connected to second source S2. As a result, second gate drive circuit 12 can apply a second positive voltage VP2 with second gate G2 on the higher potential than the potential of second source S2 between second gate G2 and second source S2 of dual-gate bidirectional switch 1. In second gate drive circuit 12, output terminal Tmg connected to the positive electrode of positive power supply E1 is connected to second gate G2, and output terminal Tms connected to the negative electrode of positive power supply E1 is connected to second source S2.

Second switch SW2 included in second gate drive circuit 12 is connected to second gate G2 via second resistor (second gate resistor) R2.

Negative power supply E2 included in second gate drive circuit 12 is a DC power supply, and a negative electrode thereof is connected to second gate G2 and a positive electrode thereof is connected to second source S2. As a result, second gate drive circuit 12 can apply a negative bias voltage (second negative voltage VN2 smaller than second threshold voltage Vth2) with second gate G2 on the lower potential than the potential of second source S2 between second gate G2 and second source S2 of dual-gate bidirectional switch 1. In second gate drive circuit 12, the negative electrode of the DC power supply constituting negative power supply E2 is connected to second gate G2 via third switch SW3 and third resistor (third gate resistor) R3.

Each of first switch SW1, second switch SW2, and third switch SW3 included in second gate drive circuit 12 is, for example, a normally-off semiconductor switch.

(2.2.3) Controller

Controller 13 controls first gate drive circuit 11 and second gate drive circuit 12.

Figure 5:
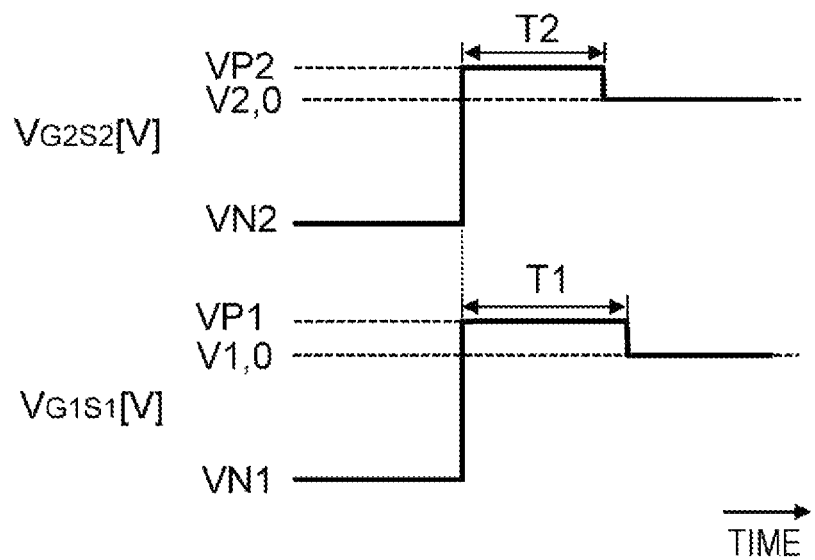
FIG. 5 is a timing chart for describing an operation of the above control system.

In control system 10 according to the exemplary embodiment, controller 13 matches the following timings at the time of turning on dual-gate bidirectional switch 1. That is, as shown in FIG. 5, the timing of starting the application of first positive voltage VP1 between first gate G1 and first source S1 from first gate drive circuit 11 is matched with the timing of starting the application of a voltage (for example, second positive voltage VP2) higher than second threshold voltage Vth2 between second gate G2 and second source S2 from second gate drive circuit 12. In addition, controller 13 controls first switch SW1, second switch SW2, and third switch SW3 of first gate drive circuit 11.

In addition, controller 13 controls a gate voltage as follows at the time of turning on dual-gate bidirectional switch 1. That is, controller 13 sets the gate voltage (gate voltage $V_{G1S1}$ or gate voltage $V_{G2S2}$) of the gate (first gate G1 or second gate G2) corresponding to the source (first source S1 or second source S2) having a relatively low potential among the two sources (first source S1 or second source S2) to the positive voltage (first positive voltage VP1 or second positive voltage VP2). Thereafter, controller 13 sets the voltage to a voltage (first voltage V1 or second voltage V2) smaller than the positive voltage (first positive voltage VP1 or second positive voltage VP2) and larger than the threshold voltage (first threshold voltage Vth1 or second threshold voltage Vth2).

(2.2.3.1) A Case where the Potential of First Source S1 is Lower than the Potential of Second Source S2

At the time of turning on dual-gate bidirectional switch 1, controller 13 applies, as shown in FIG. 5, first positive voltage VP1 for first period T1 between first gate G1 and first source S1 from first gate drive circuit 11, and applies first voltage V1 (here, 0 V) smaller than first positive voltage VP1 after first period T1 has elapsed. First voltage V1 is larger than threshold voltage Vth1 of first gate G1. Here, VP1>V1>Vth1>VN1.

Figure 6:
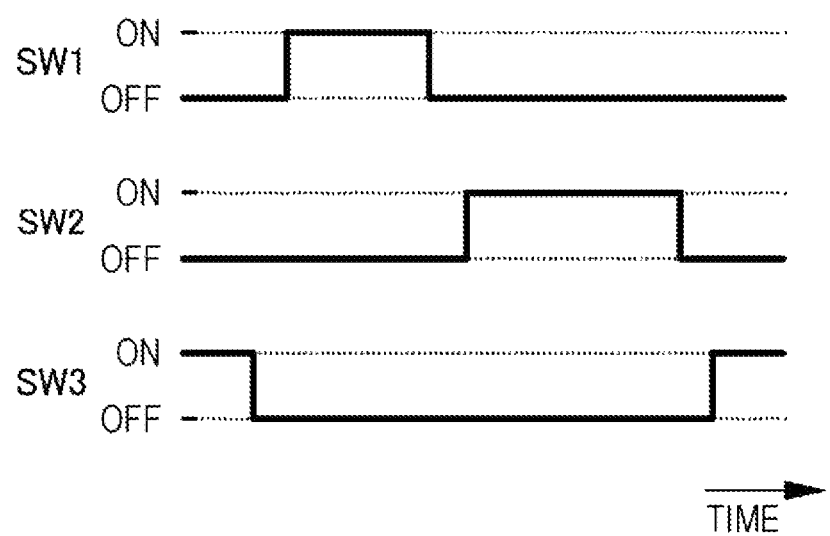
FIG. 6 is a timing chart for explaining an example of switching timings of a first switch, a second switch, and a third switch in the above control system.

In addition, controller 13 controls first switch SW1, second switch SW2, and third switch SW3 of first gate drive circuit 11 at timings shown in FIG. 6.

When controller 13 is controlling normally-on dual-gate bidirectional switch 1 to be in the OFF state, only third switch SW3 among first switch SW1, second switch SW2, and third switch SW3 is controlled to be ON. At the time of turning off dual-gate bidirectional switch 1, controller 13 controls third switch SW3 from ON to OFF, then controls first switch SW1 from OFF to ON, controls first switch SW1 to be OFF after a first constant time, and then controls second switch SW2 from OFF to ON. First period T1 is determined by an ON period (the first constant time) of first switch SW1. Here, the first constant time is a time determined by characteristics of the on-resistance between first gate G1 and first source S1. Note that, at the time of turning on dual-gate bidirectional switch 1, controller 13 may set the timing to turn off third switch SW3 to the same timing as the timing to turn on first switch SW1. In addition, controller 13 may set the timing to turn off first switch SW1 to the same timing as the timing to turn on second switch SW2.

At the time of turning off dual-gate bidirectional switch 1, controller 13 controls second switch SW2 from ON to OFF, and then controls third switch SW3 from OFF to ON.

Controller 13 may set the timing to turn off second switch SW2 to the same timing as the timing to turn on third switch SW3.

Further, at the time of turning on dual-gate bidirectional switch 1, when the potential of first source S1 is lower than the potential of second source S2, controller 13 applies, as shown in FIG. 5, second positive voltage VP2 for second period T2 between second gate G2 and second source S2 from second gate drive circuit 12, and applies second voltage V2 (e.g., 0 V) smaller than second positive voltage VP2 after second period T2 has elapsed. Second voltage V2 is larger than threshold voltage Vth2 of second gate G2. Here, VP2>V2>Vth2>VN2. Note that, second period T2 is a time determined by characteristics of the on-resistance between second gate G2 and second source S2.

In the case of, for example, controlling second gate drive circuit 12, controller 13 controls first switch SW1, second switch SW2, and third switch SW3 of second gate drive circuit 12 at timings shown in FIG. 6, similarly to first gate drive circuit 11.

Note that the relationship between first period T1 and second period T2 may be T1>T2 or T1<T2.

(2.2.3.2) A Case where the Potential of Second Source S2 is Lower than the Potential of First Source S1

At the time of turning on dual-gate bidirectional switch 1, controller 13 applies second positive voltage VP2 for second period T2 between second gate G2 and second source S2 from second gate drive circuit 12, and applies second voltage V2 (here, 0 V) smaller than second positive voltage VP2 after second period T2 has elapsed.

Further, at the time of turning on dual-gate bidirectional switch 1, controller 13 applies first positive voltage VP1 for first period T1 between first gate G1 and first source S1 from first gate drive circuit 11, and applies first voltage V1 (here, 0 V) smaller than first positive voltage VP1 after first period T1 has elapsed.

(2.2.3.3) Configuration of Controller

An execution entity of controller 13 includes a computer system. The computer system includes one or a plurality of computers. The computer system is mainly constituted of a processor and a memory as hardware. When the processor executes a program recorded in the memory of the computer system, functions of controller 13 as the execution entity in the present disclosure are implemented. The program may be stored in the memory of the computer system in advance but may be provided through a telecommunication line or may be provided in a state of being stored in a non-transitory recording medium such as a memory card, an optical disk, or a hard disk drive (magnetic disk) that can be read by the computer system. The processor of the computer system includes one or a plurality of electronic circuits including a semiconductor integrated circuit (IC) or a large-scale integrated (LSI) circuit. The plurality of electronic circuits may be integrated into one chip or may be provided in a distributed manner on a plurality of chips. The plurality of chips may be integrated in one device or may be provided in a distributed manner in a plurality of devices.

(4) Advantages (4.1) Control System

In control system 10 according to the exemplary embodiment, at the time of turning on normally-on dual-gate bidirectional switch 1, when the potential of first source S1 is lower than the potential of second source S2, controller 13 controls first gate drive circuit 11 as follows. That is, controller 13 applies first positive voltage VP1 for first period T1 between first gate G1 and first source S1 from first gate drive circuit 11, and applies first voltage V1 smaller than first positive voltage VP1 after first period T1 has elapsed. As a result, control system 10 according to the exemplary embodiment can suppress the current collapse of dual-gate bidirectional switch 1.

Figure 7:
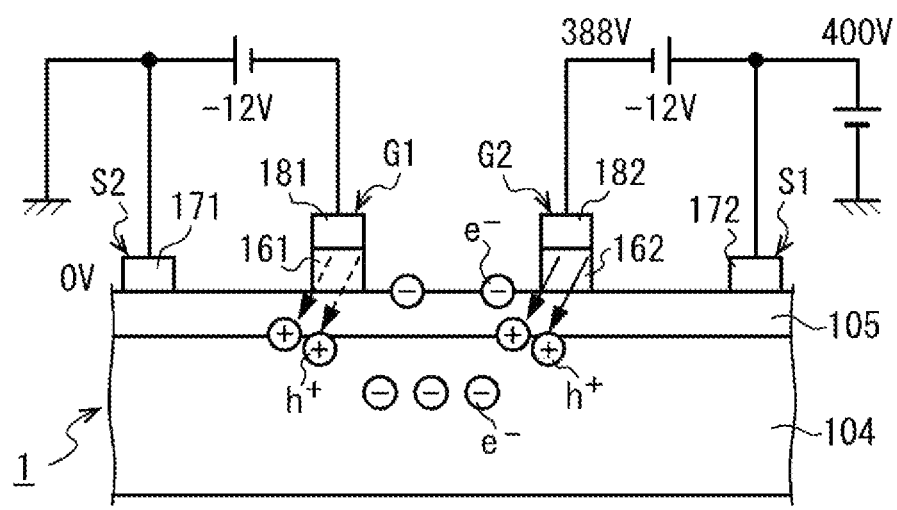
FIG. 7 is an operation explanatory diagram of the dual-gate bidirectional switch controlled by the above control system.

The current collapse is a phenomenon in which the on-resistance after dual-gate bidirectional switch 1 is turned off from the OFF state to the ON state increases. More specifically, in dual-gate bidirectional switch 1, the current collapse is a phenomenon in which, when a high voltage (stress voltage) is applied between first source S1 and second source S2, negative charges $e^-$ are captured in a defect in crystal (such as first nitride semiconductor layer 104 and second nitride semiconductor layer 105), a surface trap on the surface of second nitride semiconductor layer 105, or an interface between first nitride semiconductor layer 104 and second nitride semiconductor layer 105, and the on-resistance increases. As a result of intensive research, the inventors of the present application have obtained an experimental result that the current collapse is deteriorated in normally-on dual-gate bidirectional switch 1 as compared with the normally-off dual-gate bidirectional switch. In dual-gate bidirectional switch 1, when first gate G1 is in the OFF state and second gate G2 is in the OFF state, for example, as shown in the schematic diagram of FIG. 7, even when the negative bias voltage is applied between second gate G2 and second source S2, there is a case where second gate G2 has a higher potential than first source S1 and first gate G1. In this case, an electric field is temporarily applied between second gate G2 and negative charges $e^-$, causing holes $h^+$ to be injected easily. The injected holes $h^+$ exert an effect of canceling negative charges that cause current collapse, and can improve the current collapse. On the other hand, in the example of FIG. 7, because the potential of first gate G1 is low and holes $h^+$ are not easily injected into the crystal from first gate G1, the inventors of the present application thought that the current collapse has deteriorated.

In contrast, in control system 10 according to the exemplary embodiment, at the time of turning on normally-on dual-gate bidirectional switch 1, when the potential of first source S1 is lower than the potential of second source S2, controller 13 controls first gate drive circuit 11 as follows. That is, control system 10 applies first positive voltage VP1 for first period T1 between first gate G1 and first source S1 from first gate drive circuit 11, and applies first voltage V1 smaller than first positive voltage VP1 after first period T1 has elapsed. It has been confirmed that control system 10 according to the exemplary embodiment can suppress the current collapse of dual-gate bidirectional switch 1. It is considered that this is because holes $h^+$ are easily injected from first gate G1 in control system 10 according to the exemplary embodiment.

In addition, at the time of turning on dual-gate bidirectional switch 1, control system 10 according to the exemplary embodiment applies first positive voltage VP1 for first period T1 between first gate G1 and first source S1, and thereafter, applies first voltage V1 smaller than first positive voltage VP1. Therefore, in the case where dual-gate bidirectional switch 1 is a dual-gate GIT (e.g., a dual gate GaN-based GIT), the power loss due to the flow of gate current Ig can be suppressed. In particular, because first voltage V1=0 V, control system 10 according to the exemplary embodiment is advantageous in terms of suppressing the power loss.

In addition, at the time of turning on dual-gate bidirectional switch 1, control system 10 according to the exemplary embodiment applies second positive voltage VP2 for second period T2 between second gate G2 and second source S2, and thereafter, applies second voltage V2 smaller than second positive voltage VP2. Therefore, in the case where dual-gate bidirectional switch 1 is a dual-gate GIT (e.g., a dual gate GaN-based GIT), the power loss due to the flow of gate current Ig can be suppressed. In particular, because second voltage V2=0 V, control system 10 according to the exemplary embodiment is advantageous in terms of suppressing the power loss.

From the viewpoint of suppressing the power loss, control system 10 according to the exemplary embodiment preferably maintains the first gate voltage at first voltage V1 and maintains the second gate voltage at second voltage V2 in the case of maintaining the ON state after dual-gate bidirectional switch 1 is turned on.

(4.2) Switch System

Switch system 20 according to the exemplary embodiment includes control system 10 and dual-gate bidirectional switch 1. As a result, switch system 20 according to the exemplary embodiment can suppress the current collapse of dual-gate bidirectional switch 1.

(4.3) Control Method for Dual-Gate Bidirectional Switch

Control system 10 according to the exemplary embodiment can realize a control method for dual-gate bidirectional switch 1 described as follows.

In the control method for dual-gate bidirectional switch 1, dual-gate bidirectional switch 1 is a normally-on dual-gate bidirectional switch 1 having first gate G1, first source S1 corresponding to first gate G1, second gate G2, and second source S2 corresponding to second gate G2. In the control method for the dual-gate directional switch, at the time of turning on dual-gate bidirectional switch 1, when the potential of first source S1 is lower than the potential of second source S2, first positive voltage VP1 is applied for first period T1 between first gate G1 and first source S1, and first voltage V1 smaller than first positive voltage VP1 is applied after first period T1 has elapsed.

Accordingly, the control method for dual-gate bidirectional switch 1 can suppress the current collapse of normally-on dual-gate bidirectional switch 1.

The control method for dual-gate bidirectional switch 1 described above is not limited to the case of being realized by control system 10 described above.

(5) Modifications (5.1) First Modification

A circuit configuration of control system 10 according to a first modification of the exemplary embodiment is the same as that of control system 10 (see FIG. 1) according to the exemplary embodiment, and thus illustration and description thereof are omitted.

Figure 8A:
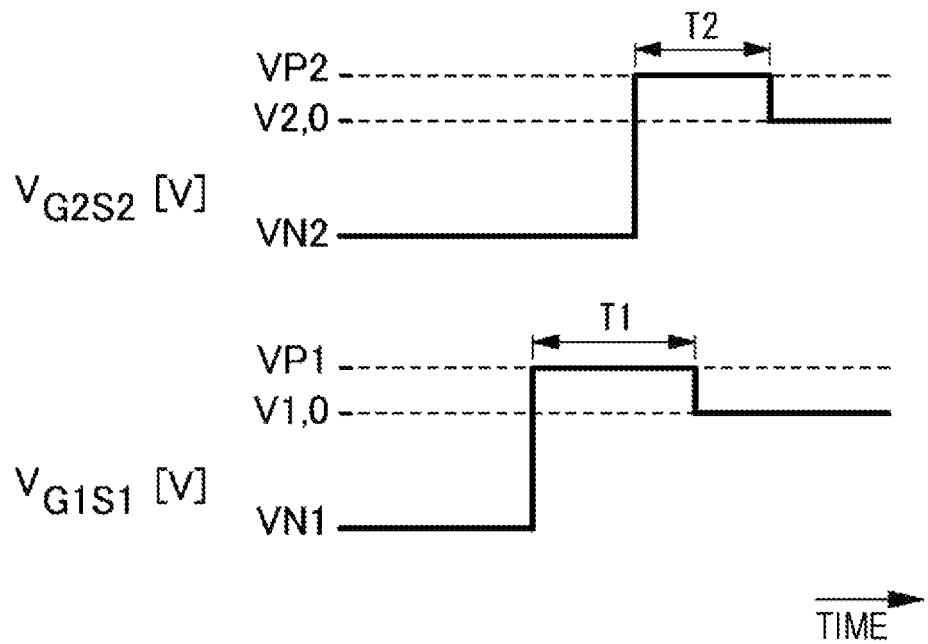
FIG. 8A is an operation explanatory diagram of a control system according to a first modification of the exemplary embodiment.

In control system 10 according to the first modification, at the time of turning on normally-on dual-gate bidirectional switch 1, when the potential of first source S1 is lower than the potential of second source S2, controller 13 controls first gate drive circuit 11 and second gate drive circuit 12 to cause first gate voltage $V_{G1S1}$ and second gate voltage $V_{G2S2}$ to change as shown in FIG. 8A. That is, controller 13 starts the application of first positive voltage VP1 between first gate G1 and first source S1 from first gate drive circuit 11, and thereafter, starts the application of a voltage (for example, second positive voltage VP2) higher than a threshold voltage (second threshold voltage Vth2) within first period T1 between second gate G2 and second source S2 from second gate drive circuit 12. As a result, in control system 10 according to the first modification, holes are easily injected from first gate G1, and current collapse can be suppressed.

(5.2) Second Modification

A circuit configuration of control system 10 according to a second modification of the exemplary embodiment is the same as that of control system 10 (see FIG. 1) according to the exemplary embodiment, and thus illustration and description thereof are omitted.

Figure 8B:
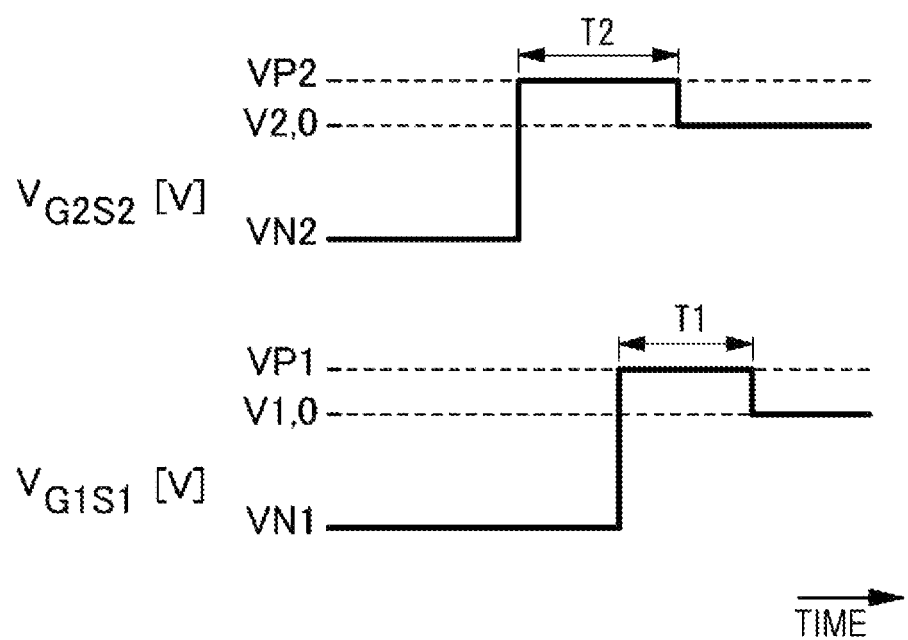
FIG. 8B is an operation explanatory diagram of a control system according to a second modification of the exemplary embodiment.

In control system 10 according to the second modification, at the time of turning on normally-on dual-gate bidirectional switch 1, when the potential of second source S2 is higher than the potential of first source S1, controller 13 controls first gate drive circuit 11 and second gate drive circuit 12 to cause first gate voltage $V_{G1S1}$ and second gate voltage $V_{G2S2}$ to change as shown in FIG. 8B. That is, controller 13 starts the application of second positive voltage VP2 between second gate G2 and second source S2 from second gate drive circuit 12, and thereafter, starts the application of first positive voltage VP1 within second period T2 between first gate G1 and first source S1 from first gate drive circuit 11. As a result, in control system 10 according to the second modification, because negative charges e near the gate (second gate G2) having a relatively high potential among first gate G1 and second gate G2 are suppressed by the injection of holes $h^+$ from second gate G2, and thereafter, first positive voltage VP1 is applied between the gate (first gate G1) having a relatively low potential and first source S1, the current collapse can be further suppressed.

(5.3) Third Modification

A circuit configuration of control system 10 according to a third modification of the exemplary embodiment is substantially the same as that of control system 10 (see FIG. 1) according to the exemplary embodiment, and thus illustration and description thereof are omitted.

Figure 9:
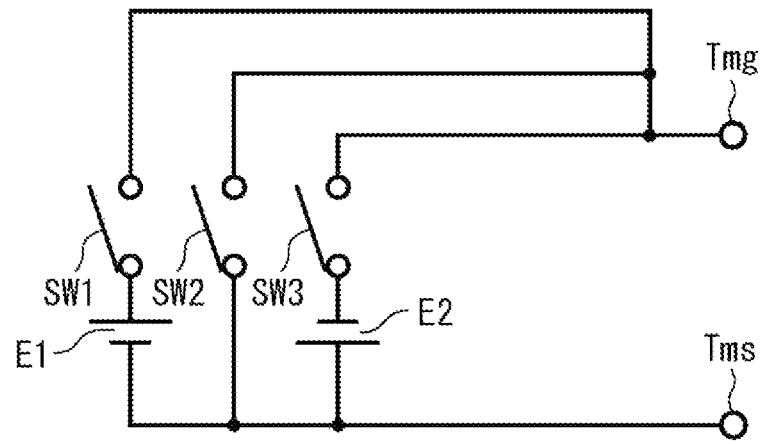
FIG. 9 is a circuit diagram of a first gate drive circuit and a second gate drive circuit in a control system according to a third modification of the exemplary embodiment.

FIG. 9 shows a circuit configuration of each of first gate drive circuit 11 and second gate drive circuit 12 according to the third modification.

Control system 10 according to the third modification is different from control system 10 shown in FIGS. 1, 2A, and 2B in that each of first gate drive circuit 11 and second gate drive circuit 12 does not include first resistor R1, second resistor R2, and third resistor R3 as shown in FIG. 9. Therefore, in each of first gate drive circuit 11 and second gate drive circuit 12, a series circuit of positive power supply E1 and first switch SW1, second switch SW2, and a series circuit of negative power supply E2 and third switch SW3 are connected in parallel. Note that first gate drive circuit 11 has the same configuration as second gate drive circuit 12.

Control system 10 according to the third modification can reduce the number of components as compared with control system 10 shown in FIGS. 1, 2A, and 2B.

(5.4) Other Modifications

In each of the exemplary embodiment and the first to third modifications, dual-gate bidirectional switch 1 controlled by control system 10 is not limited to the dual-gate GIT, and may be, for example, a dual-gate Metal-Oxide-Semiconductor Field Effect Transistor (MOSFET). However, in each of the following modifications, dual-gate bidirectional switch 1 controlled by control system 10 is a dual-gate GIT.

(5.4.1) Fourth Modification

An entire circuit configuration of control system 10 according to a fourth modification of the exemplary embodiment is substantially the same as that of control system 10 (see FIG. 1) according to the exemplary embodiment, and thus illustration and description thereof are omitted.

Figure 10:
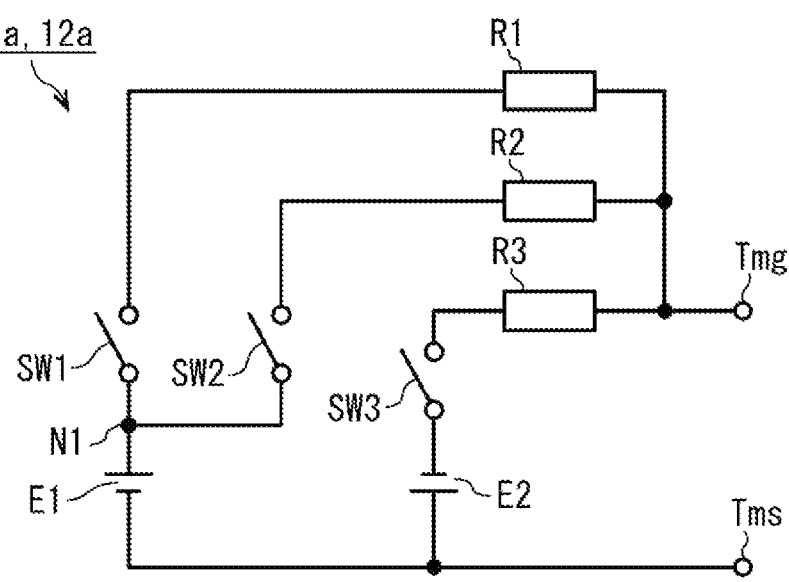
FIG. 10 is a circuit diagram of a first gate drive circuit and a second gate drive circuit in a control system according to a fourth modification of the exemplary embodiment.

Control system 10 according to the fourth modification is different from control system 10 shown in FIGS. 1, 2A, and 2B in including first gate drive circuit 11a and second gate drive circuit 12a as shown in FIG. 10 instead of first gate drive circuit 11 and second gate drive circuit 12 in control system 10 according to the exemplary embodiment. First gate drive circuit 11a has the same configuration as second gate drive circuit 12a. In each of first gate drive circuit 11a and second gate drive circuit 12a, the same components as those of first gate drive circuit 11 and second gate drive circuit 12 are denoted by the same reference numerals, and the description thereof is appropriately omitted.

Each of first gate drive circuit 11a and second gate drive circuit 12a has a pair of output terminals Tmg and Tms. In addition, each of first gate drive circuit 11a and second gate drive circuit 12a includes, between the pair of output terminals Tmg and Tms, a series circuit including positive power supply E1, first switch SW1, and first resistor R1, a series circuit including positive power supply E1, second switch SW2, and second resistor R2, and a series circuit including negative power supply E2, third switch SW3, and third resistor R3. Second switch SW2 is connected between node N1 on the path between the positive electrode of positive power supply E1 and first switch SW1, and second resistor R2. In each of first gate drive circuit 11a and second gate drive circuit 12a, the resistance value of first resistor R1 is smaller than the resistance value of second resistor R2.

In first gate drive circuit 11a, output terminal Tmg is connected to first gate G1, and output terminal Tms is connected to first source S1. Therefore, in first gate drive circuit 11a, a series circuit including positive power supply E1, first switch SW1, and first resistor R1, a series circuit including positive power supply E1, second switch SW2, and second resistor R2, and a series circuit including negative power supply E2, third switch SW3, and third resistor R3, are connected between first gate G1 and first source S1.

In second gate drive circuit 12a, output terminal Tmg is connected to second gate G2, and output terminal Tms is connected to second source S2. Therefore, in second gate drive circuit 12a, a series circuit including positive power supply E1, first switch SW1, and first resistor R1, a series circuit including positive power supply E1, second switch SW2, and second resistor R2, and a series circuit including negative power supply E2, third switch SW3, and third resistor R3, are connected between second gate G2 and second source S2.

Figure 11:
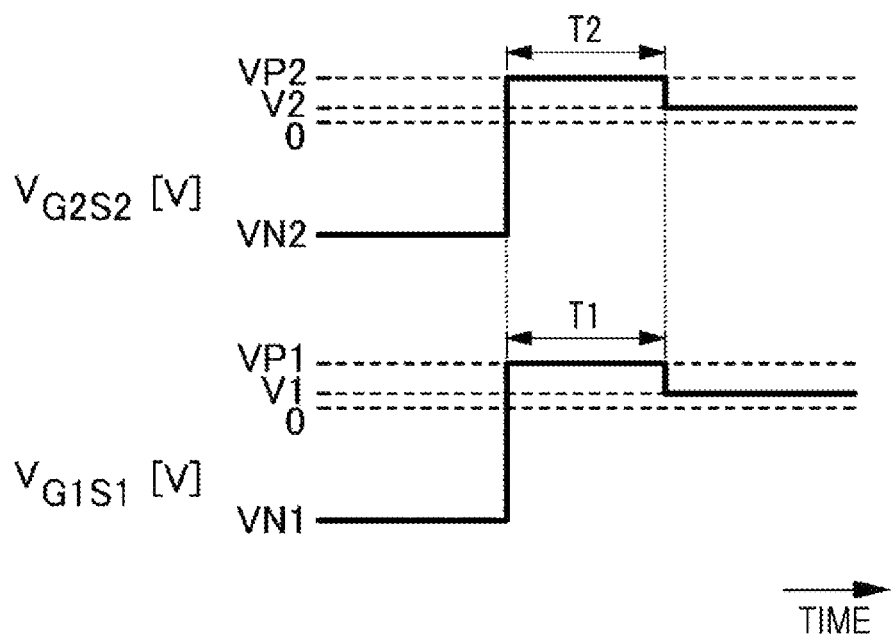
FIG. 11 is an operation explanatory diagram of the above control system.

Similarly to the control of first gate drive circuit 11 by controller 13 in control system 10 according to the exemplary embodiment, controller 13 controls first switch SW1, second switch SW2, and third switch SW3 of first gate drive circuit 11a, for example, at timings shown in FIG. 6. Accordingly, first gate voltage $V_{G1S1}$ changes as shown in FIG. 11 at the time of turning on dual-gate bidirectional switch 1. In control system 10 according to the fourth modification, VP1>V1>0 V>Vth1>VN1 is satisfied. The resistance value of second resistor R2 in first gate drive circuit 11a is determined so as to satisfy, for example, 0 V<V1<1 V. The resistance value of second resistor R2 is larger than the resistance value of first resistor R1.

Similarly to the control of first gate drive circuit 11 by controller 13 in control system 10 according to the exemplary embodiment, controller 13 controls first switch SW1, second switch SW2, and third switch SW3 of second gate drive circuit 12a, for example, at timings shown in FIG. 6. Accordingly, second gate voltage $V_{G2S2}$ changes as shown in FIG. 11 at the time of turning on dual-gate bidirectional switch 1. In control system 10 according to the fourth modification, VP2>V2>0 V>Vth2>VN2 is satisfied. The resistance value of second resistor R2 in second gate drive circuit 12a is determined so as to satisfy, for example, 0

V<V2<1 V. The resistance value of second resistor R2 is larger than the resistance value of first resistor R1.

In control system 10 according to the fourth modification, at the time of turning on dual-gate bidirectional switch 1, by switching and turning on first switch SW1 and second switch SW2 of first gate drive circuit 11a, first gate voltage $V_{G1S1}$ can be changed by the difference between the resistance values of first resistor R1 and second resistor R2. Further, in control system 10 according to the fourth modification, at the time of turning on dual-gate bidirectional switch 1, by switching and turning on first switch SW1 and second switch SW2 of second gate drive circuit 12a, second gate voltage $V_{G2S2}$ can be changed by the difference between the resistance values of first resistor R1 and second resistor R2.

(5.4.2) Fifth Modification

An entire circuit configuration of control system 10 according to a fifth modification of the exemplary embodiment is substantially the same as that of control system 10 (see FIG. 1) according to the exemplary embodiment, and thus illustration and description thereof are omitted.

Figure 12:
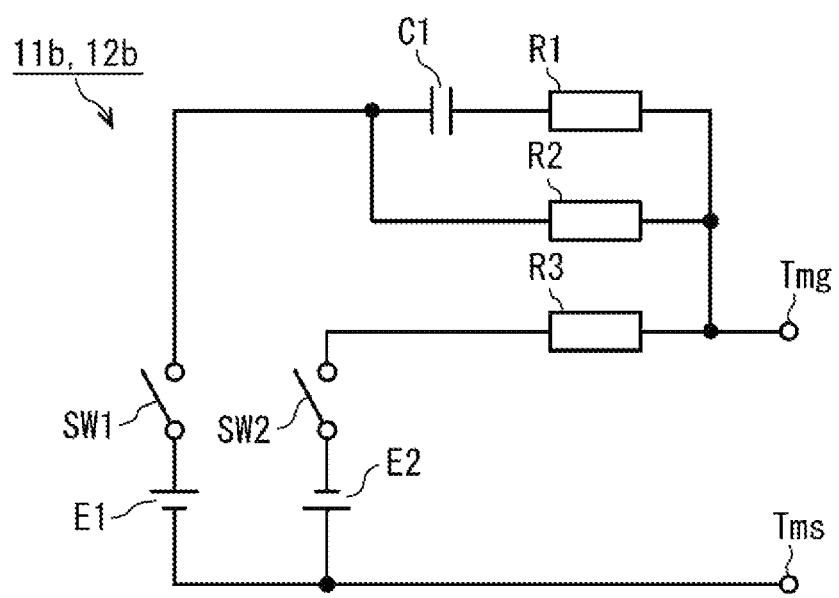
FIG. 12 is a circuit diagram of a first gate drive circuit and a second gate drive circuit in a control system according to a fifth modification of the exemplary embodiment.

Control system 10 according to the fifth modification is different from control system 10 shown in FIGS. 1, 2A, and 2B in including first gate drive circuit 11b and second gate drive circuit 12b as shown in FIG. 12 instead of first gate drive circuit 11 and second gate drive circuit 12 in control system 10 according to the exemplary embodiment shown in FIGS. 1, 2A, and 2B. First gate drive circuit 11b has the same configuration as second gate drive circuit 12b. In each of first gate drive circuit 11b and second gate drive circuit 12b, the same components as those of first gate drive circuit 11 and second gate drive circuit 12 are denoted by the same reference numerals, and the description thereof is appropriately omitted.

Each of first gate drive circuit 11b and second gate drive circuit 12b has a pair of output terminals Tmg and Tms. Each of first gate drive circuit 11b and second gate drive circuit 12b includes a series circuit including positive power supply E1, first switch SW1, capacitor C1, and first resistor R1, which are connected between the pair of output terminals Tmg and Tms. Further, each of first gate drive circuit 11b and second gate drive circuit 12b includes second resistor R2 connected in parallel to a series circuit of capacitor C1 and first resistor R1. Further, each of first gate drive circuit 11b and second gate drive circuit 12b includes a series circuit including negative power supply E2, second switch SW2, and third resistor R3, which are connected between the pair of output terminals Tmg and Tms. In each of first gate drive circuit 11b and second gate drive circuit 12b, the resistance value of first resistor R1 is smaller than the resistance value of second resistor R2.

In first gate drive circuit 11b, output terminal Tmg is connected to first gate G1, and output terminal Tms is connected to first source S1. Therefore, in first gate drive circuit 11b, a series circuit including positive power supply E1, first switch SW1, capacitor C1, and first resistor R1, a series circuit including positive power supply E1, first switch SW1, and second resistor R2, and a series circuit including negative power supply E2, third switch SW3, and third resistor R3, are connected between first gate G1 and first source S1. In first gate drive circuit 11b, capacitor C1, first resistor R1, and second resistor R2 constitute a speed-up circuit. The speed-up circuit is a circuit for turning on dual-gate bidirectional switch 1 at a higher speed. The impedance of the series circuit of capacitor C1 and first resistor R1 is smaller than the impedance of second resistor R2.

In second gate drive circuit 12b, output terminal Tmg is connected to second gate G2, and output terminal Tms is connected to second source S2. Therefore, in second gate drive circuit 12b, a series circuit including positive power supply E1, first switch SW1, capacitor C1, and first resistor R1, a series circuit including positive power supply E1, first switch SW1, and second resistor R2, and a series circuit including negative power supply E2, third switch SW3, and third resistor R3, are connected between second gate G2 and second source S2. In second gate drive circuit 12b, capacitor C1, first resistor R1, and second resistor R2 constitute a speed-up circuit. The speed-up circuit is a circuit for turning on dual-gate bidirectional switch 1 at a higher speed. The impedance of the series circuit of capacitor C1 and first resistor R1 is smaller than the impedance of second resistor R2.

Figure 13:
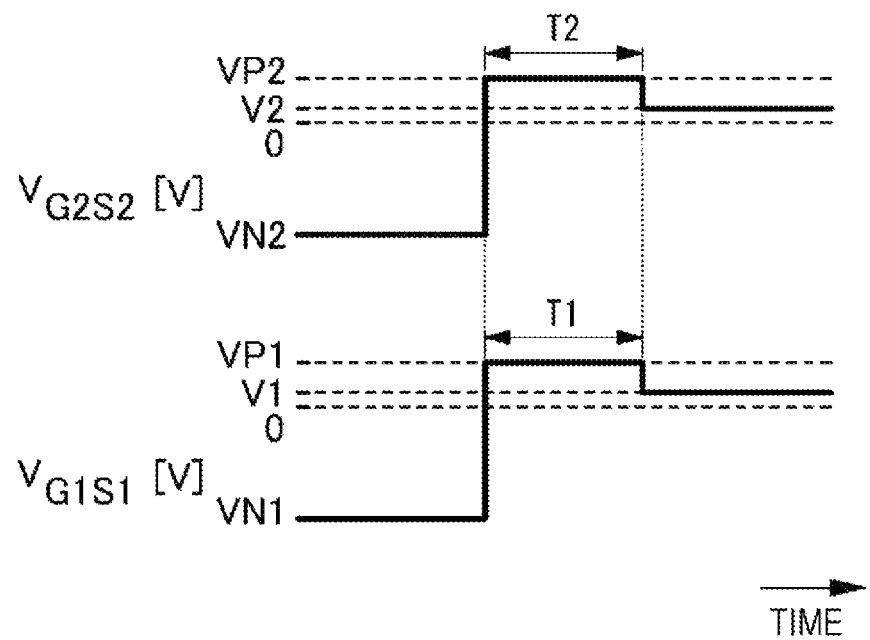
FIG. 13 is an operation explanatory diagram of the above control system.

Controller 13 controls first switch SW1 and second switch SW2 of first gate drive circuit 11b. At the time of turning off dual-gate bidirectional switch 1, controller 13 controls first switch SW1 from OFF to ON, controls first switch SW1 to be OFF after a first constant time, and then controls second switch SW2 from OFF to ON. In the fifth modification, first period T1 is determined by a time from when first switch SW1 is turned on until electric charge is accumulated in capacitor C1 and current stops flowing in capacitor C1, and is set to be shorter than the first constant time. When the current stops flowing through capacitor C1, the current flowing through first gate G1 is only the current flowing from positive power supply E1 through first switch SW1 and second resistor R2. Accordingly, first gate voltage $V_{G1S1}$ changes as shown in FIG. 13 at the time of turning on dual-gate bidirectional switch 1. In control system 10 according to the fifth modification, VP1≥V1>0 V>Vth1>VN1 is satisfied. Because first positive voltage VP1 is applied between first gate G1 and first source S1 when the current is flowing into first gate G1 through positive power supply E1, first switch SW1, capacitor C1, and first resistor R1, first positive voltage VP1 decreases with the lapse of time. Note that, at the time of turning on dual-gate bidirectional switch 1, controller 13 may set the timing to turn off first switch SW1 of first gate drive circuit 11b to the same timing as the timing to turn on second switch SW2 thereof.

Further, controller 13 controls first switch SW1 and second switch SW2 of second gate drive circuit 12b. Accordingly, second gate voltage $VG_{G2S2}$ changes as shown in FIG. 13 at the time of turning on dual-gate bidirectional switch 1. In control system 10 according to the fifth modification, VP2≥V2>0 V>Vth2>VN2 is satisfied. Because second positive voltage VP2 is applied between second gate G2 and second source S2 when the current is flowing into second gate G2 through positive power supply E1, first switch SW1, capacitor C1, and first resistor R1, second positive voltage VP2 decreases with the lapse of time. Note that, at the time of turning on dual-gate bidirectional switch 1, controller 13 may set the timing to turn off first switch SW1 of second gate drive circuit 12b to the same timing as the timing to turn on second switch SW2 thereof.

In control system 10 according to the fifth modification of the exemplary embodiment, because the number of switches can be reduced from three to two in each of first gate drive circuit 11b and second gate drive circuit 12b as compared with first gate drive circuit 11 and second gate drive circuit 12, it is advantageous in terms of downsizing and cost reduction.

(5.4.3) Sixth Modification

An entire circuit configuration of control system 10 according to a sixth modification of the exemplary embodiment is substantially the same as that of control system 10 (see FIG. 1) according to the exemplary embodiment, and thus illustration and description thereof are omitted.

Figure 14:
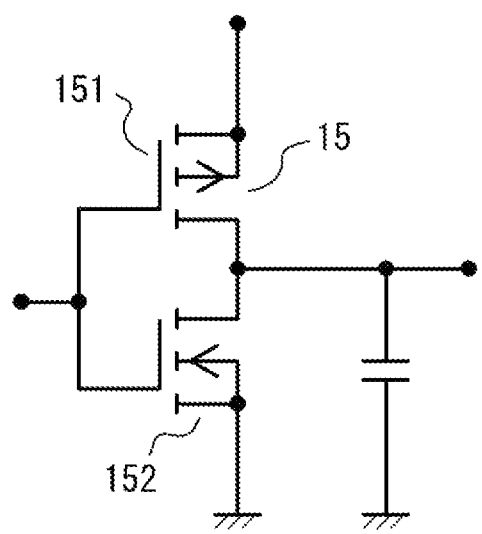
FIG. 14 is a circuit diagram of a complementary metal-oxide semiconductor (CMOS) inverter in a control system according to a sixth modification of the exemplary embodiment.

Control system 10 according to the sixth modification is different from control system 10 according to the fifth modification in that each of first gate drive circuit 11b and second gate drive circuit 12b includes a complementary metal-oxide semiconductor (CMOS) inverter 15 as a driver IC as shown in FIG. 14 instead of the series circuit of positive power supply E1 and first switch SW1 and the series circuit of negative power supply E2 and second switch SW2.

Figure 15:
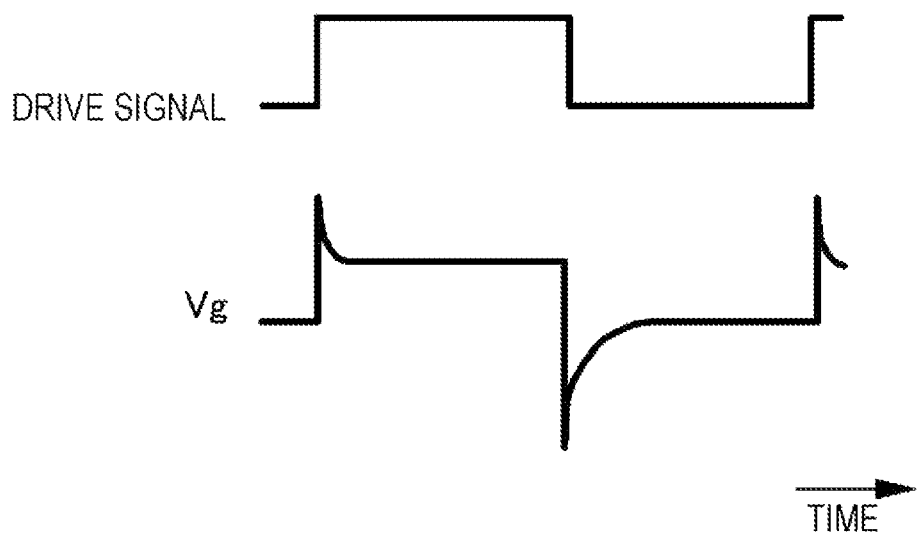
FIG. 15 is an operation explanatory diagram of the above control system.

CMOS inverter 15 includes an anti-series circuit of a p-channel MOSFET 151 and n-channel MOSFET 152. In CMOS inverter 15, the gates of p-channel MOSFET 151 and n-channel MOSFET 152 are connected to each other, the drains of p-channel MOSFET 151 and n-channel MOSFET 152 are connected to each other, the source of p-channel MOSFET 151 is connected to, for example, a 12 V power supply, and the source of n-channel MOSFET 152 is connected to a −12 V power supply. In switch system 20 including control system 10, as shown in FIG. 15, the potential level of the output voltage of CMOS inverter 15 changes according to the potential of the drive signal input from controller 13 to CMOS inverter 15 to cause gate voltage Vg to change.

In first gate drive circuit 11b, CMOS inverter 15 as an alternative to the series circuit of positive power supply E1 and first switch SW1 can selectively output first positive voltage VP1 and first negative voltage VN1 less than first threshold voltage Vth1.

In addition, in second gate drive circuit 12b, CMOS inverter 15 as an alternative to the series circuit of positive power supply E1 and first switch SW1 can selectively output second positive voltage VP2 and second negative voltage VN2 less than second threshold voltage Vth2.

Similarly to control system 10 according to the exemplary embodiment, control system 10 according to the sixth modification can suppress the current collapse of dual-gate bidirectional switch 1.

(5.4.4) Seventh Modification

An entire circuit configuration of control system 10 according to a seventh modification of the exemplary embodiment is substantially the same as that of control system 10 (see FIG. 1) according to the exemplary embodiment, and thus illustration and description thereof are omitted.

Figure 16:
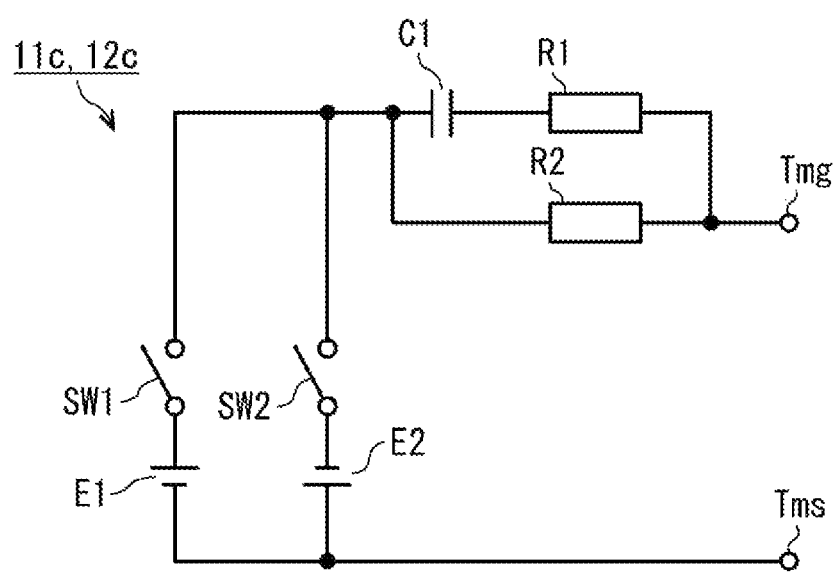
FIG. 16 is a circuit diagram of a first gate drive circuit and a second gate drive circuit in a control system according to a seventh modification of the exemplary embodiment.

Control system 10 according to the seventh modification is different from control system 10 according to the exemplary embodiment in including first gate drive circuit 11c and second gate drive circuit 12c as shown in FIG. 16 instead of first gate drive circuit 11 and second gate drive circuit 12 in control system 10 according to the exemplary embodiment. First gate drive circuit 11c has the same configuration as second gate drive circuit 12c. In each of first gate drive circuit 11c and second gate drive circuit 12c, the same components as those of first gate drive circuit 11 and second gate drive circuit 12 are denoted by the same reference numerals, and the description thereof is appropriately omitted.

Each of first gate drive circuit 11c and second gate drive circuit 12c has a pair of output terminals Tmg and Tms. In addition, each of first gate drive circuit 11c and second gate drive circuit 12c includes, between the pair of output terminals Tmg and Tms, a series circuit of positive power supply E1, first switch SW1, capacitor C1, and first resistor R1, a series circuit of negative power supply E2 and second switch SW2, the series circuit being connected in parallel to the series circuit of positive power supply E1 and first switch SW1, and second resistor R2 connected in parallel to the series circuit of capacitor C1 and first resistor R1. The resistance value of first resistor R1 is smaller than the resistance value of second resistor R2.

In first gate drive circuit 11c, output terminal Tmg is connected to first gate G1, and output terminal Tms is connected to first source S1. Therefore, in first gate drive circuit 11c, the series circuit including positive power supply E1, first switch SW1, capacitor C1, and first resistor R1, and a series circuit including positive power supply E1, first switch SW1, and second resistor R2, are connected between first gate G1 and first source S1. Further, in first gate drive circuit 11c, second resistor R2 is connected to the series circuit of capacitor C1 and first resistor R1, and capacitor C1, first resistor R1, and second resistor R2 constitute a speed-up circuit. The speed-up circuit is a circuit for turning on dual-gate bidirectional switch 1 at a higher speed. The impedance of the series circuit of capacitor C1 and first resistor R1 is smaller than the impedance of second resistor R2. In addition, in first gate drive circuit 11c, the series circuit of negative power supply E2 and second switch SW2 is connected in parallel to the series circuit of positive power supply E1 and first switch SW1.

In second gate drive circuit 12c, output terminal Tmg is connected to second gate G2, and output terminal Tms is connected to second source S2. Therefore, in second gate drive circuit 12c, a series circuit including positive power supply E1, first switch SW1, capacitor C1, and first resistor R1, and a series circuit including positive power supply E1, first switch SW1, and second resistor R2, are connected between second gate G2 and second source S2. Further, in second gate drive circuit 12c, second resistor R2 is connected to the series circuit of capacitor C1 and first resistor R1, and capacitor C1, first resistor R1, and second resistor R2 constitute a speed-up circuit. The speed-up circuit is a circuit for turning on dual-gate bidirectional switch 1 at a higher speed. The impedance of the series circuit of capacitor C1 and first resistor R1 is smaller than the impedance of second resistor R2. In addition, in second gate drive circuit 12c, the series circuit of negative power supply E2 and second switch SW2 is connected in parallel to the series circuit of positive power supply E1 and first switch SW1.

Controller 13 controls first switch SW1 and second switch SW2 of first gate drive circuit 11c. At the time of turning off dual-gate bidirectional switch 1, controller 13 controls first switch SW1 from OFF to ON, controls first switch SW1 to be OFF after a first constant time, and then controls second switch SW2 from OFF to ON. First period T1 is determined by a time from when first switch SW1 is turned on until electric charge is accumulated in capacitor C1 and current stops flowing in capacitor C1, and is set to be shorter than the first constant time. When the current stops flowing through capacitor C1, the current flows through first gate G1 from positive power supply E1 through first switch SW1 and second resistor R2. Accordingly, first gate voltage $V_{G1S1}$ changes as shown in FIG. 13 at the time of turning on dual-gate bidirectional switch 1. In control system 10 according to the seventh modification, $VP1 \geq V1 > 0$ $V > Vth1 > VN1$ is satisfied. Because first positive voltage VP1 is applied between first gate G1 and first source S1 when the current is flowing into first gate G1 through positive power supply E1, first switch SW1, capacitor C1, and first resistor R1, first positive voltage VP1 decreases with the lapse of time. Note that, at the time of turning on dual-gate bidirectional switch 1, controller 13 may set the timing to turn off first switch SW1 of first gate drive circuit 11c to the same timing as the timing to turn on second switch SW2 thereof.

Further, controller 13 controls first switch SW1 and second switch SW2 of second gate drive circuit 12c. Accordingly, second gate voltage $V_{G2S2}$ changes as shown in FIG. 13 at the time of turning on dual-gate bidirectional switch 1. In control system 10 according to the seventh modification, VP2≥V2>0 V>Vth2>VN2 is satisfied. Because second positive voltage VP2 is applied between second gate G2 and second source S2 when the current is flowing into second gate G2 through positive power supply E1, first switch SW1, capacitor C1, and first resistor R1, second positive voltage VP2 decreases with the lapse of time. Note that, at the time of turning on dual-gate bidirectional switch 1, controller 13 may set the timing to turn off first switch SW1 of second gate drive circuit 12c to the same timing as the timing to turn on second switch SW2 thereof.

Similarly to control system 10 according to the exemplary embodiment, control system 10 according to the seventh modification can suppress the current collapse of dual-gate bidirectional switch 1.

(5.4.5) Eighth Modification

An entire circuit configuration of control system 10 according to an eighth modification of the exemplary embodiment is substantially the same as that of control system 10 (see FIG. 1) according to the exemplary embodiment, and thus illustration and description thereof are omitted.

Figure 17A:
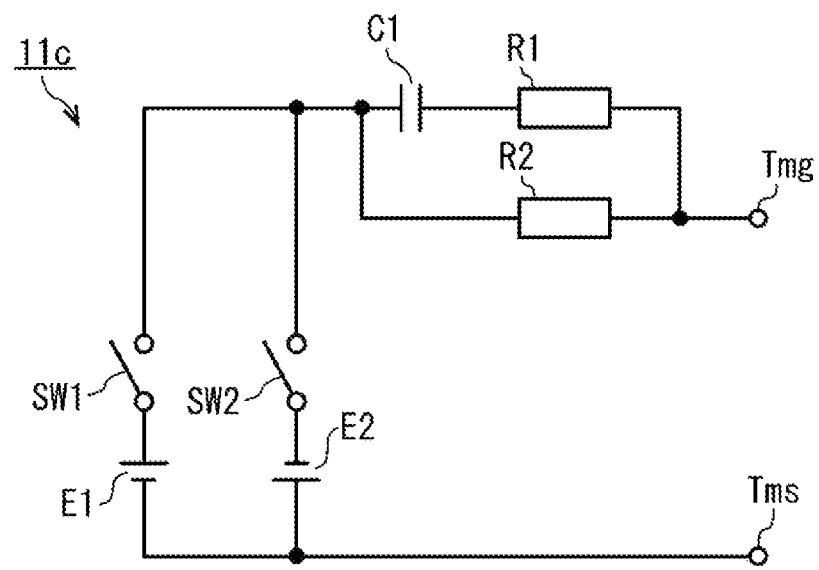
FIG. 17A is a circuit diagram of a first gate drive circuit in a control system according to an eighth modification of the exemplary embodiment.
Figure 17B:
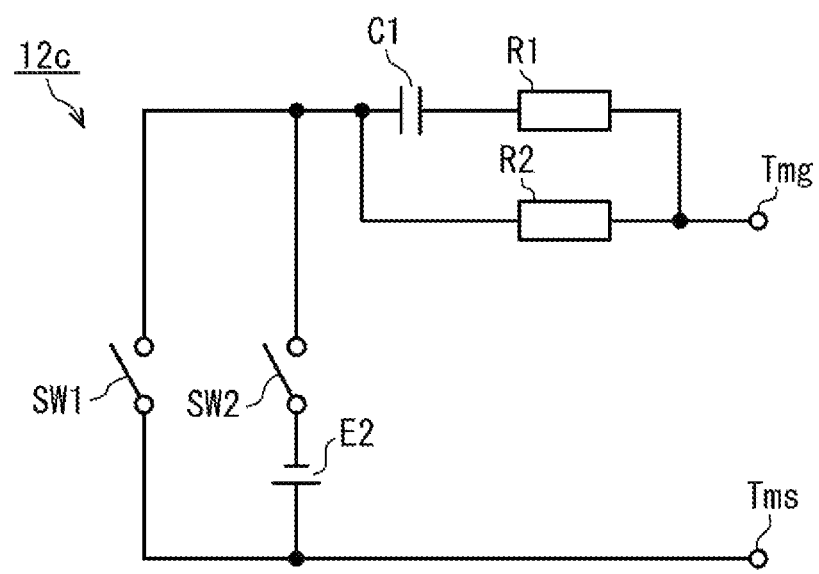
FIG. 17B is a circuit diagram of a second gate drive circuit in the above control system.

Control system 10 according to the eighth modification is substantially the same as control system 10 according to the seventh modification, and is different from control system 10 according to the seventh modification in that second gate drive circuit 12c does not include positive power supply E1 included in first gate drive circuit 11c as shown in FIG. 17B.

In control system 10 according to the eighth modification, at the time of turning on dual-gate bidirectional switch 1, first switch SW1 of first gate drive circuit 11c is turned on, and also first switch SW1 of second gate drive circuit 12c is turned on. Further, in control system 10 according to the eighth modification, at the time of turning off dual-gate bidirectional switch 1, first switch SW1 of each of first gate drive circuit 11c and second gate drive circuit 12c is turned off, and thereafter, second switch SW2 is turned on.

Figure 18:
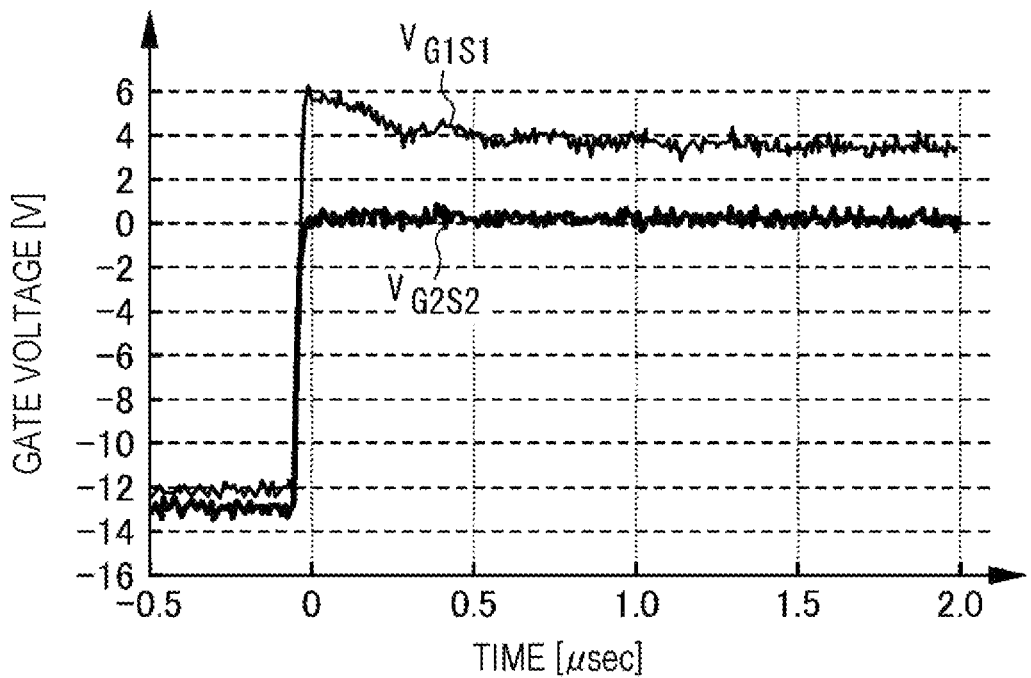
FIG. 18 is a waveform diagram of a first gate voltage and a second gate voltage of the switch system including the above control system.

FIG. 18 shows an example of waveforms of first gate voltage $V_{G1S1}$ and second gate voltage $V_{G2S2}$ in the case where control system 10 according to the eighth modification is used.

Figure 19:
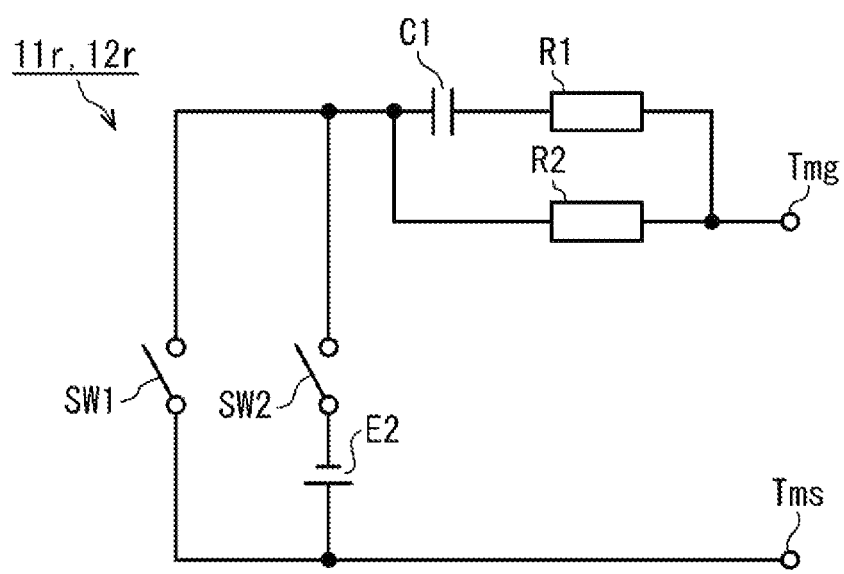
FIG. 19 is a circuit diagram of a first gate drive circuit and a second gate drive circuit in a control system according to a comparative example.

On the other hand, as shown in FIG. 19, in the control system according to a comparative example in which each of first gate drive circuit 11r and second gate drive circuit 12r does not have positive power supply E1 similarly to second gate drive circuit 12c, at the time of turning on dual-gate bidirectional switch 1, first switch SW1 of first gate drive circuit 11r is turned on, and first switch SW1 of second gate drive circuit 12r is also turned on. Further, in the control system according to the comparative example, at the time of turning off dual-gate bidirectional switch 1, first switch SW1 of each of first gate drive circuit 11r and second gate drive circuit 12r is turned off, and thereafter, second switch SW2 is turned on.

Figure 20:
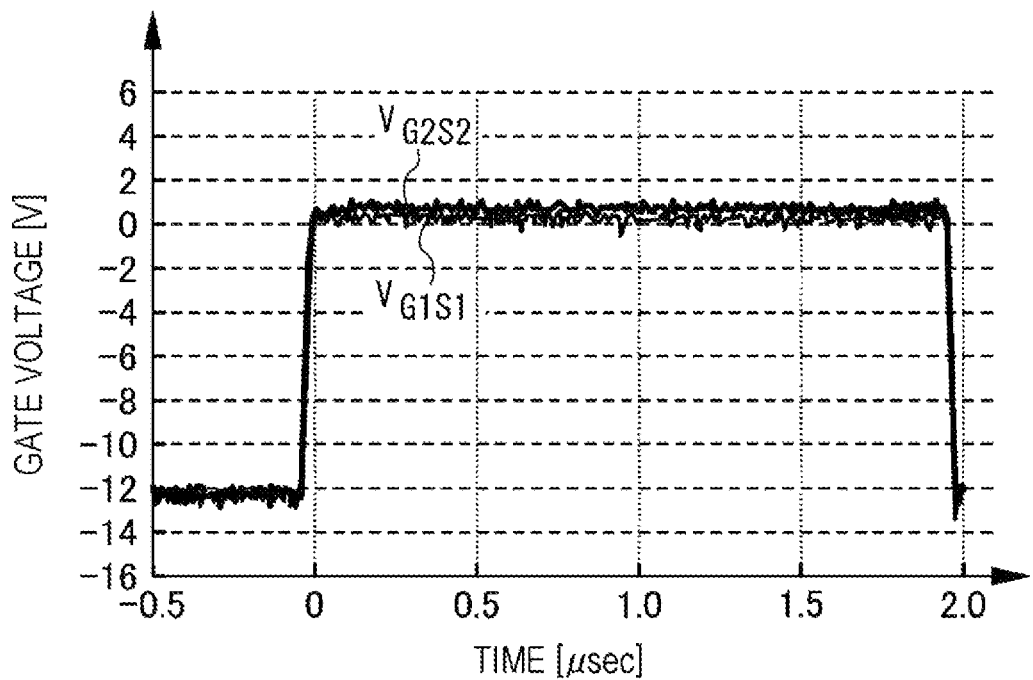
FIG. 20 is a waveform diagram of a first gate voltage and a second gate voltage of the switch system including the above control system.

FIG. 20 shows an example of waveforms of first gate voltage $V_{G1S1}$ and second gate voltage $V_{G2S2}$ in the case where the control system according to the comparative example is used.

Figure 21:
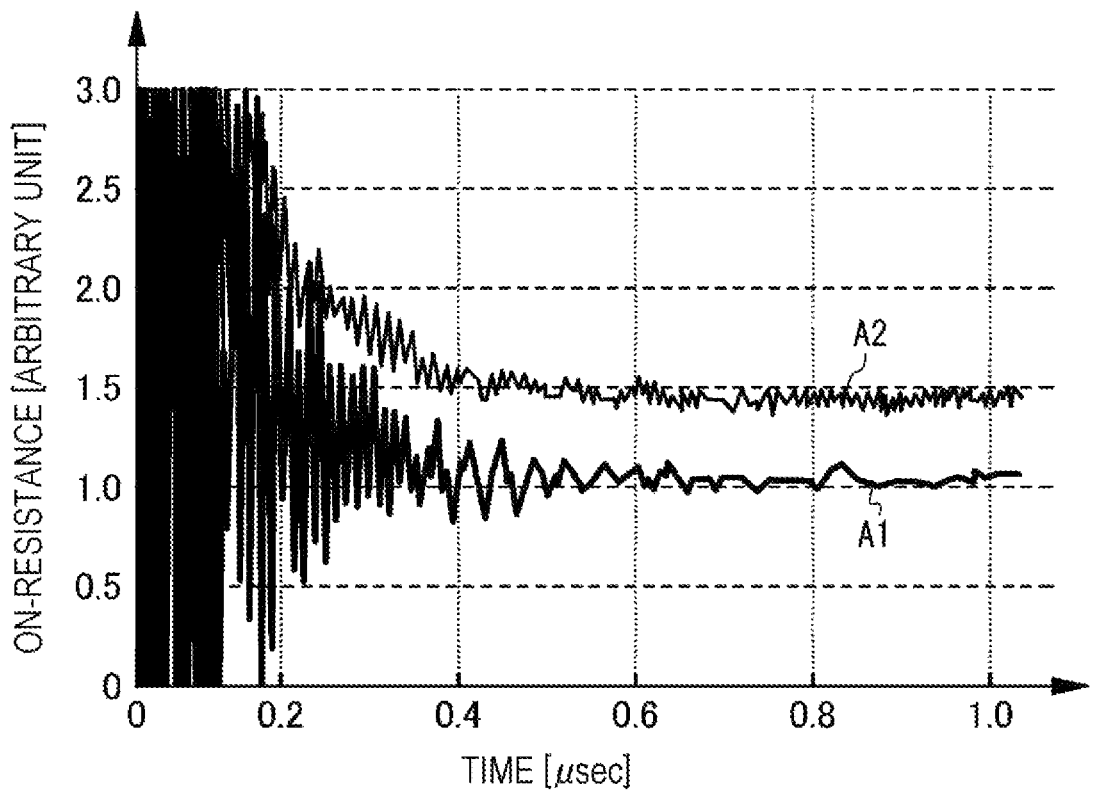
FIG. 21 is a characteristic diagram of on-resistance of a control system according to an eighth modification of the exemplary embodiment and a control system according to a comparative example.

In FIG. 21, the change overtime of the on-resistance at the time of turning on dual-gate bidirectional switch 1 using control system 10 according to the eighth modification is indicated by solid line A1, and the change over time of the on-resistance at the time of turning on dual-gate bidirectional switch 1 using the control system according to the comparative example is indicated by solid line A2. FIG. 21 shows a change with time of the on-resistance at the time of turning on dual-gate bidirectional switch 1 in a state where a voltage of 400 V is applied between first source S1 and second source S2 of dual-gate bidirectional switch 1 with second source S2 on the higher potential than the potential of first source S1. A current flowing through dual-gate bidirectional switch 1 in the ON state of dual-gate bidirectional switch 1 is 10 A. The vertical axis in FIG. 21 is an on-resistance normalized with the on-resistance when no current collapse occurs as 1 with respect to solid line A1. In FIG. 21, at the time of turning on dual-gate bidirectional switch 1 using control system according to the eighth modification, the on-resistance can be reduced as compared with the case where dual-gate bidirectional switch 1 is turned on using the control system according to the comparative example. From the other perspective, at the time of turning on dual-gate bidirectional switch 1 using the control system according to the comparative example, the on-resistance is larger by about 50% as compared with the case where dual-gate bidirectional switch 1 is turned on using the control system according to the eighth modification.

In contrast, when the DC voltage is applied to dual-gate bidirectional switch 1 to evaluate the static characteristics of dual-gate bidirectional switch 1, the difference in the on-resistance between the case where first gate voltage $V_{G1S1}$ is 0 V and the case where first gate voltage $V_{G1S1}$ is 3 V is less than or equal to 10%. Therefore, the reason that the on-resistance is reduced at the time of turning on dual-gate bidirectional switch 1 using the control system according to the eighth modification shown in FIG. 21 as compared to the case where dual-gate bidirectional switch 1 is turned on using the control system according to the comparative example, is considered to be because there is an effect of suppressing the current collapse.

(5.4.6) Ninth Modification

An entire circuit configuration of control system 10 according to a ninth modification of the exemplary embodiment is substantially the same as that of control system 10 (see FIG. 1) according to the exemplary embodiment, and thus illustration and description thereof are omitted.

Figure 22:
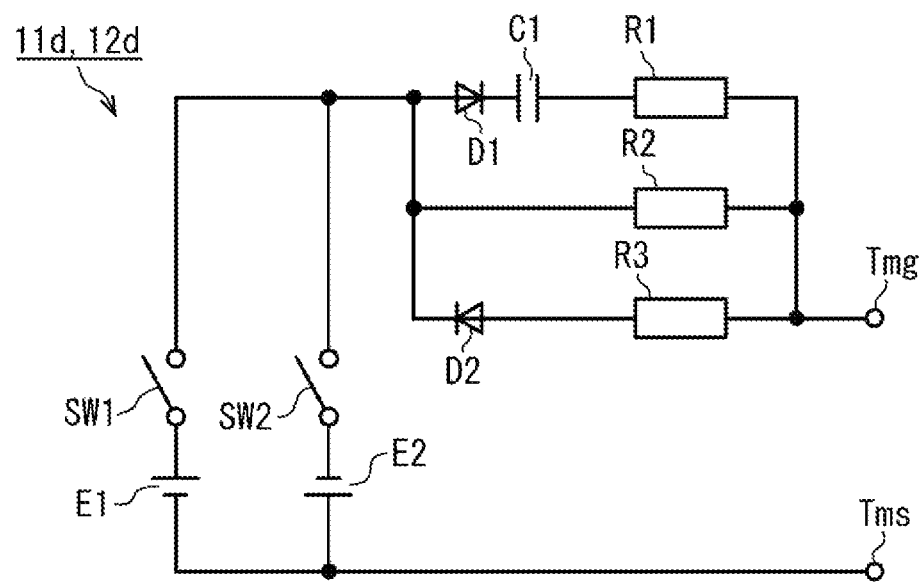
FIG. 22 is a circuit diagram of a first gate drive circuit and a second gate drive circuit in a control system according to a ninth modification of the exemplary embodiment.

Control system 10 according to the ninth modification is different from control system 10 according to the exemplary embodiment in including first gate drive circuit 11d and second gate drive circuit 12d as shown in FIG. 22 instead of first gate drive circuit 11 and second gate drive circuit 12 in control system 10 according to the exemplary embodiment. First gate drive circuit 11d has the same configuration as second gate drive circuit 12d. In each of first gate drive circuit 11d and second gate drive circuit 12d, the same components as those of first gate drive circuit 11 and second gate drive circuit 12 are denoted by the same reference numerals, and the description thereof is appropriately omitted.

Each of first gate drive circuit 11d and second gate drive circuit 12d has a pair of output terminals Tmg and Tms. Each of first gate drive circuit 11d and second gate drive circuit 12d includes a series circuit of positive power supply E1, first switch SW1, first diode D1, capacitor C1, and first resistor R1, which are connected between the pair of output terminals Tmg and Tms. In addition, each of first gate drive circuit 11d and second gate drive circuit 12d includes a series circuit of negative power supply E2 and second switch SW2, the series circuit being connected in parallel to the series circuit of positive power supply E1 and first switch SW1. Further, each of first gate drive circuit 11d and second gate drive circuit 12d includes second resistor R2 connected in parallel to a series circuit of first diode D1, capacitor C1, and first resistor R1. Further, each of first gate drive circuit 11d and second gate drive circuit 12d includes a series circuit of second diode D2 and third resistor R3, the series circuit being connected in parallel to the series circuit of first diode D1, capacitor C1, and first resistor R1.

The anode of first diode D1 is connected to the positive electrode of positive power supply E1 via first switch SW1, and is connected to the negative electrode of negative power supply E2 via second switch SW2. The cathode of second diode D2 is connected to the positive electrode of positive power supply E1 via first switch SW1, and is connected to the negative electrode of negative power supply E2 via second switch SW2. The resistance value of first resistor R1 is smaller than the resistance value of second resistor R2. The resistance value of third resistor R3 is smaller than the resistance value of second resistor R2. Controller 13 controls first switch SW1 and second switch SW2.

In control system 10 according to the ninth modification, at the time of turning on dual-gate bidirectional switch 1, first switch SW1 of first gate drive circuit 11d is turned on, and also first switch SW1 of second gate drive circuit 12d is turned on.

In the control system 10, at the time of turning on dual-gate bidirectional switch 1, controller 13 turns on first switch SW1 of first gate drive circuit 11d to cause first positive voltage VP1 to be applied by charging first gate G1 through a path passing from positive power supply E1 through first diode D1, capacitor C1, and first resistor R1. Then, because control system 10 can supply gate current Ig through a path passing through second resistor R2 when the electric charge is accumulated in capacitor C1, first gate voltage $V_{G1S1}$ of dual-gate bidirectional switch 1 can be set to first voltage V1. Here, as the resistance value of second resistor R2 increases, gate current Ig can be reduced, and the power loss in first gate G1 can be reduced.

In control system 10, at the time of turning on dual-gate bidirectional switch 1, controller 13 turns on first switch SW1 of second gate drive circuit 12d to cause second positive voltage VP2 to be applied by charging second gate G2 through a path passing from positive power supply E1 through first diode D1, capacitor C1, and first resistor R1. Then, because control system 10 can supply gate current Ig through a path passing through second resistor R2 when the electric charge is accumulated in capacitor C1, second gate voltage $V_{G2S2}$ of dual-gate bidirectional switch 1 can be set to second voltage V2. Here, as the resistance value of second resistor R2 increases, gate current Ig can be reduced, and the power loss in second gate G2 can be reduced.

Further, in control system 10 according to the ninth modification, at the time of turning off dual-gate bidirectional switch 1, first switch SW1 of each of first gate drive circuit 11d and second gate drive circuit 12d is turned off, and thereafter, second switch SW2 is turned on.

In control system 10, at the time of turning off dual-gate bidirectional switch 1, controller 13 turns off first switch SW1 of first gate drive circuit 11d and turns on second switch SW2 thereof to cause the electric charge of first gate G1 to be discharged through the path passing through second resistor R2 and the path passing through third resistor R3 and second diode D2, and thereafter, first gate voltage $V_{G1S1}$ can be maintained at first negative voltage VN1.

In control system 10, at the time of turning off the dual-gate bidirectional switch 1, controller 13 turns off first switch SW1 of second gate drive circuit 12d and turns on second switch SW2 thereof to cause the electric charge of second gate G2 to be discharged through the path passing through second resistor R2 and the path passing through third resistor R3 and second diode D2, and thereafter, second gate voltage $V_{G2S2}$ can be maintained at second negative voltage VN2.

As described above, in control system 10 according to the ninth modification, first gate drive circuit 11d includes the series circuit of second diode D2 and third resistor R3, the series circuit being connected in parallel to the series circuit of first diode D1, capacitor C1, and first resistor R1, and to second resistor R2. Second diode D2 is connected to a node between first switch SW1 and second switch SW2 in a direction opposite to the direction of first diode D1. In short, the cathode of second diode D2 is connected to the anode of first diode D1. Therefore, control system 10 according to the ninth modification can separate the path for applying first positive voltage VP1 at the time of turning on dual-gate bidirectional switch 1 from the path for adjusting the turn-off speed at the time of turning off dual-gate bidirectional switch 1. As a result, control system 10 according to the ninth modification can independently control the magnitude of first positive voltage VP1 and the switch loss at the time of turn-off.

As described above, in control system 10 according to the ninth modification, second gate drive circuit 12d includes the series circuit of second diode D2 and third resistor R3, the series circuit being connected in parallel to the series circuit of first diode D1, capacitor C1, and first resistor R1 and to second resistor R2. Second diode D2 is connected to a node between first switch SW1 and second switch SW2 in a direction opposite to the direction of first diode D1. In short, the cathode of second diode D2 is connected to the anode of first diode D1. Therefore, control system 10 according to the ninth modification can separate the path for applying second positive voltage VP2 at the time of turning on dual-gate bidirectional switch 1 from the path for adjusting the turn-off speed at the time of turning off dual-gate bidirectional switch 1. As a result, control system according to the ninth modification can independently control the magnitude of second positive voltage VP2 and the switch loss at the time of turn-off.

(5.4.7) Tenth Modification

An entire circuit configuration of control system 10 according to a tenth modification of the exemplary embodiment is substantially the same as that of control system 10 (see FIG. 1) according to the exemplary embodiment, and thus illustration and description thereof are omitted.

Figure 23:
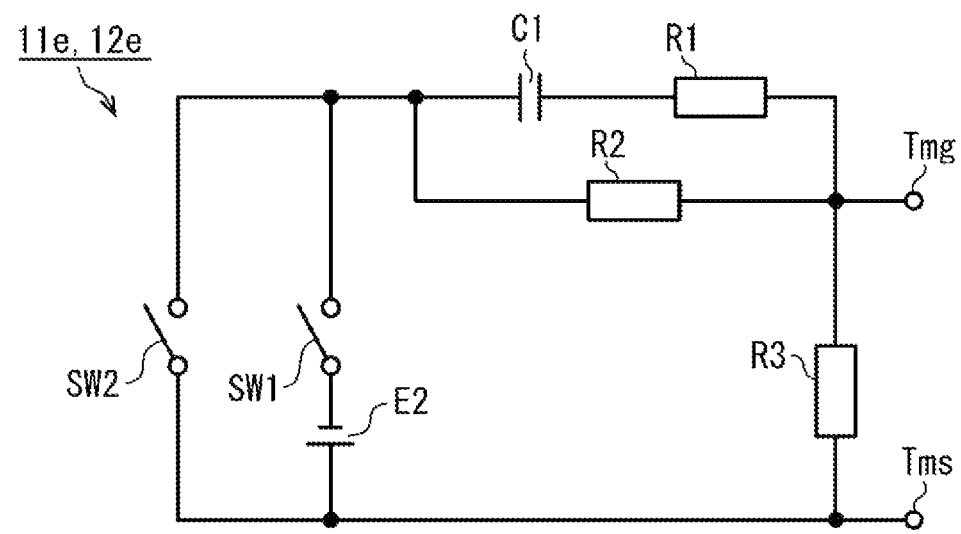
FIG. 23 is a circuit diagram of a first gate drive circuit and a second gate drive circuit in a control system according to a tenth modification of the exemplary embodiment.

Control system 10 according to the tenth modification is different from control system 10 shown in FIGS. 1, 2A, and 2B in including first gate drive circuit 11e and second gate drive circuit 12e as shown in FIG. 23 instead of first gate drive circuit 11 and second gate drive circuit 12 in control system 10 according to the exemplary embodiment shown in FIGS. 1, 2A, and 2B. First gate drive circuit 11e has the same configuration as second gate drive circuit 12e. In each of first gate drive circuit 11e and second gate drive circuit 12e, the same components as those of first gate drive circuit 11 and second gate drive circuit 12 are denoted by the same reference numerals, and the description thereof is appropriately omitted.

Each of first gate drive circuit 11e and second gate drive circuit 12e has a pair of output terminals Tmg and Tms. Each of first gate drive circuit 11e and second gate drive circuit 12e includes a series circuit of negative power supply E2, first switch SW1, capacitor C1, and first resistor R1, which are connected between the pair of output terminals Tmg and Tms. In addition, each of first gate drive circuit 11e and second gate drive circuit 12e includes second switch SW2 connected in parallel to a series circuit of negative power supply E2 and first switch SW1. Further, each of first gate drive circuit 11e and second gate drive circuit 12e includes second resistor R2 connected in parallel to a series circuit of capacitor C1 and first resistor R1. Each of first gate drive circuit 11e and second gate drive circuit 12e includes third resistor R3 connected between the pair of output terminals Tmg and Tms. The resistance value of first resistor R1 is smaller than the resistance value of second resistor R2.

Controller 13 controls first switch SW1 and second switch SW2.

Figure 24A:
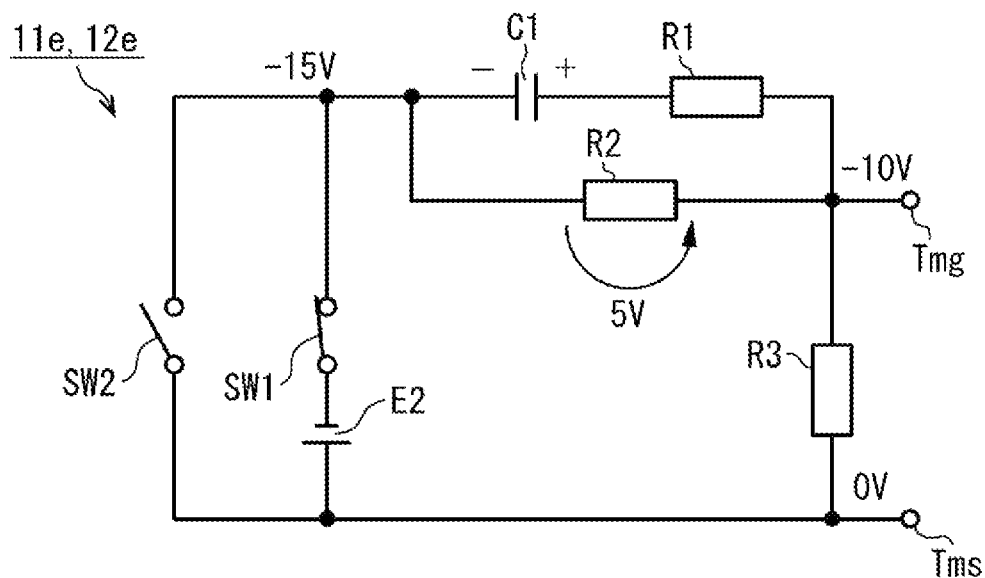
FIG. 24A is an operation explanatory diagram of the above control system.

Further, as shown in FIG. 24A, at the time of turning off dual-gate bidirectional switch 1, controller 13 turns on first switch SW1 of each of first gate drive circuit 11e and second gate drive circuit 12e. By turning off gate voltage $V_{G1S1}$ of first gate G1 and gate voltage $V_{G2S2}$ of second gate G2 when dual-gate bidirectional switch 1 is off are set to Vgoff, gate voltage Vgoff converges to a value obtained by dividing the voltage of negative power supply E2 by second resistor R2 and third resistor R3. By setting the voltage of negative power supply E2 to Vdd, the resistance value of second resistor R2 to r2, and the resistance value of third resistor R3 is r3, Vgoff converges to a value of the following formula.

$$Vgoff=Vdd-\{r3/(r2+r3)\}$$

Here, Vgoff is smaller than first threshold voltage Vth1 and second threshold voltage Vth2.

For example, assuming that the voltage of negative power supply E2 is −15 V and the resistance value of third resistor R3 is twice the resistance value of second resistor R2, Vgoff is −10 V, the voltage across second resistor R2 is 5 V, and a voltage of 5 V is applied to capacitor C1 in a state where no current flows. Here, assuming that the amount of charge of capacitor C1 is Q, the capacitance of capacitor C1 is C, and the voltage of capacitor C1 is V, a charge determined by Q=CV is accumulated in capacitor C1.

Figure 24B:
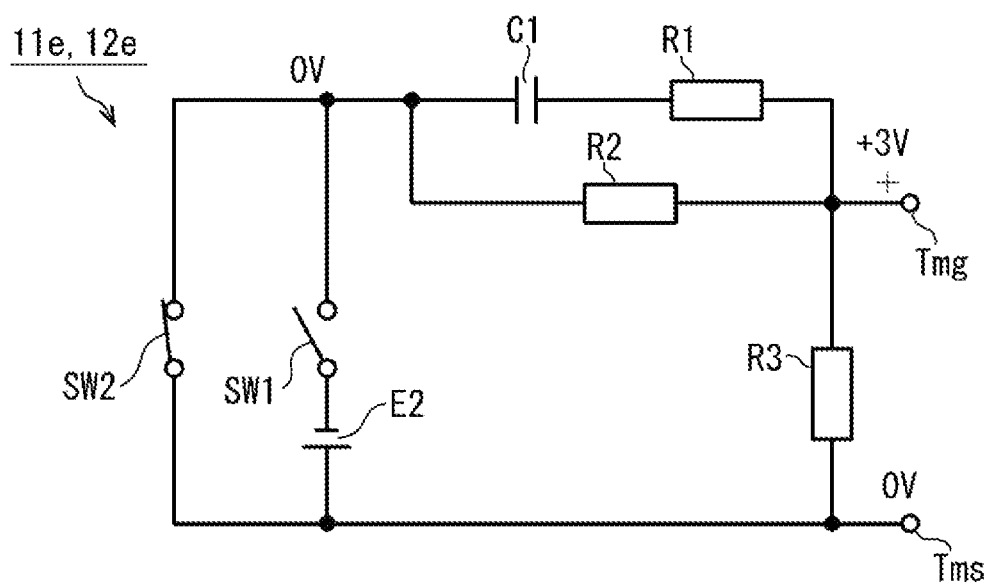
FIG. 24B is an operation explanatory diagram of the above control system.

Note that, at the time of turning on dual-gate bidirectional switch 1, as shown in FIG. 24B, controller 13 turns off first switch SW1 and turns on second switch SW2. As a result, because first gate drive circuit 11e can discharge a part of the positive charge of capacitor C1 to first gate G1, first gate voltage $V_{G1S1}$ can be temporarily set to first positive voltage VP1 (for example, 3 V) even when the potential at the node between first switch SW1 and second switch SW2 is 0 V. Further, because second gate drive circuit 12e can discharge a part of the positive charge of capacitor C1 to second gate G2, second gate voltage $V_{G2S2}$ can be temporarily set to second positive voltage VP2 (for example, 3 V).

Accordingly, similarly to control system 10 according to the exemplary embodiment, control system 10 according to the tenth modification can suppress the current collapse of dual-gate bidirectional switch 1.

Because control system 10 according to the tenth modification only needs to include negative power supply E2 as a power supply, the cost can be reduced as compared with control system 10 according to the exemplary embodiment.

In each of first gate drive circuit 11e and second gate drive circuit 12e in control system 10 according to the tenth modification, capacitor C1 is used to generate the positive voltage (first positive voltage VP1 and second positive voltage VP2) from negative power supply E2. Because the gate capacitance is required to be charged with the charge stored in capacitor C1, the capacitance of capacitor C1 is preferably large in order to generate the positive voltage. The product of the voltage across capacitor C1 and the capacitance of capacitor C1 in the off state of the dual-gate bidirectional switch 1 is preferably larger than the product of the gate voltage of the dual-gate bidirectional switch 1 in the OFF state and the gate-source capacitance in the ON state. The capacitance of capacitor C1 is preferably twice or more the minimum capacitance of capacitor C1 obtained when the above relationship is expressed by an inequality expression.

(5.4.8) Eleventh Modification

An entire circuit configuration of control system 10 according to an eleventh modification of the exemplary embodiment is substantially the same as that of control system 10 (see FIG. 1) according to the exemplary embodiment, and thus illustration and description thereof are omitted.

Figure 25:
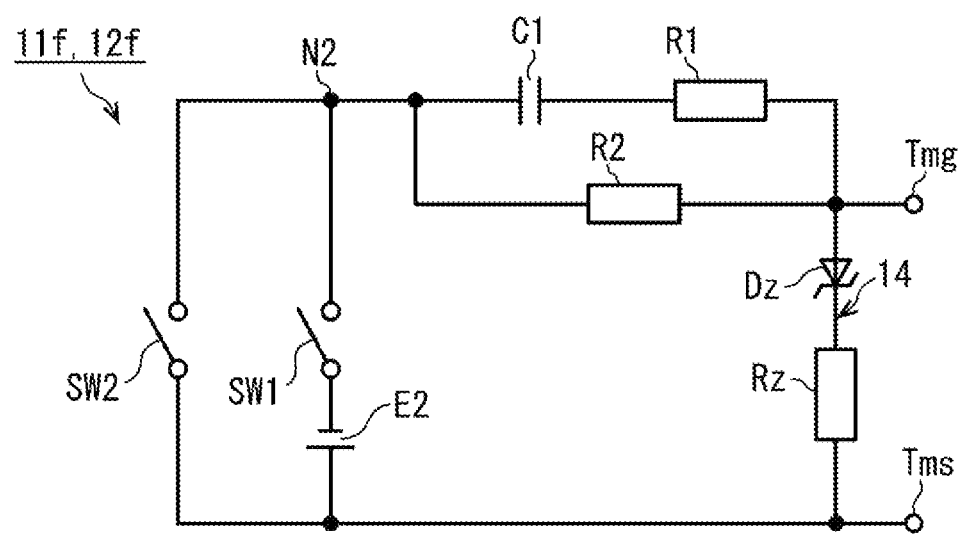
FIG. 25 is a circuit diagram of a first gate drive circuit and a second gate drive circuit in a control system according to an eleventh modification of the exemplary embodiment.

Control system 10 according to the eleventh modification is different from control system 10 shown in FIGS. 1, 2A, and 2B in including first gate drive circuit 11f and second gate drive circuit 12f as shown in FIG. 25 instead of first gate drive circuit 11 and second gate drive circuit 12 in control system 10 according to the exemplary embodiment shown in FIGS. 1, 2A, and 2B. First gate drive circuit 11f has the same configuration as second gate drive circuit 12f. In each of first gate drive circuit 11f and second gate drive circuit 12f, the same components as those of first gate drive circuit 11 and second gate drive circuit 12 are denoted by the same reference numerals, and the description thereof is appropriately omitted.

Each of first gate drive circuit 11f and second gate drive circuit 12f has a pair of output terminals Tmg and Tms. Each of first gate drive circuit 11f and second gate drive circuit 12f includes a series circuit of negative power supply E2, first switch SW1, capacitor C1, and first resistor R1, which are connected between the pair of output terminals Tmg and Tms. In addition, each of first gate drive circuit 11f and second gate drive circuit 12f includes second switch SW2 connected in parallel to a series circuit of negative power supply E2 and first switch SW1. Further, each of first gate drive circuit 11f and second gate drive circuit 12f includes second resistor R2 connected in parallel to a series circuit of capacitor C1 and first resistor R1. In each of first gate drive circuit 11f and second gate drive circuit 12f, the resistance value of first resistor R1 is smaller than the resistance value of second resistor R2.

Control system 10 further includes clamp circuits 14 respectively corresponding to first gate drive circuit 11f and second gate drive circuit 12f. Each of two clamp circuits 14 is connected between the pair of output terminals Tmg and Tms. Clamp circuit 14 corresponding to first gate drive circuit 11f is connected between first gate G1 and first source S1, and clamps the voltage between first gate G1 and first source S1. Clamp circuit 14 corresponding to second gate drive circuit 12f is connected between second gate G2 and second source S2, and clamps the voltage between second gate G2 and second source S2.

Clamp circuit 14 includes, for example, a series circuit of Zener diode Dz and resistor Rz. The anode of Zener diode Dz is connected to output terminal Tmg, and the cathode thereof is connected to output terminal Tms via resistor Rz.

Controller 13 controls first switch SW1 and second switch SW2.

Figure 26A:
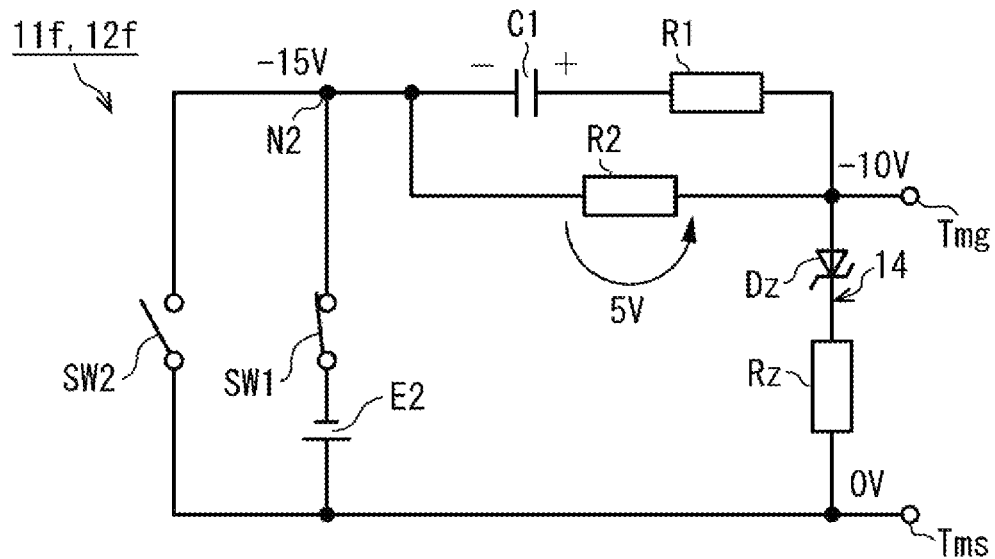
FIG. 26A is an operation explanatory diagram of the above control system.

Further, as shown in FIG. 26A, at the time of turning off dual-gate bidirectional switch 1, controller 13 turns on first switch SW1 of each of first gate drive circuit 11f and second gate drive circuit 12f. By setting gate voltage $V_{G1S1}$ of first gate G1 and gate voltage $V_{G2S2}$ of second gate G2 when dual-gate bidirectional switch 1 is off are set to Vgoff, gate voltage Vgoff is clamped by clamp circuit 14. Here, Vgoff is smaller than first threshold voltage Vth1 and second threshold voltage Vth2.

For example, assuming that the voltage of negative power supply E2 is −15 V, the voltage at node N2 between first switch SW1 and second switch SW2 is −15 V, and the clamp voltage of clamp circuit 14 is −10 V, Vgoff is −10V, the voltage across second resistor R2 is 5 V, and a voltage of 5 V is applied to capacitor C1 in a state where no current flows. Here, assuming that the amount of charge of capacitor C1 is Q, the capacitance of capacitor C1 is C, and the voltage of capacitor C1 is V, a charge determined by Q=CV is accumulated in capacitor C1.

Figure 26B:
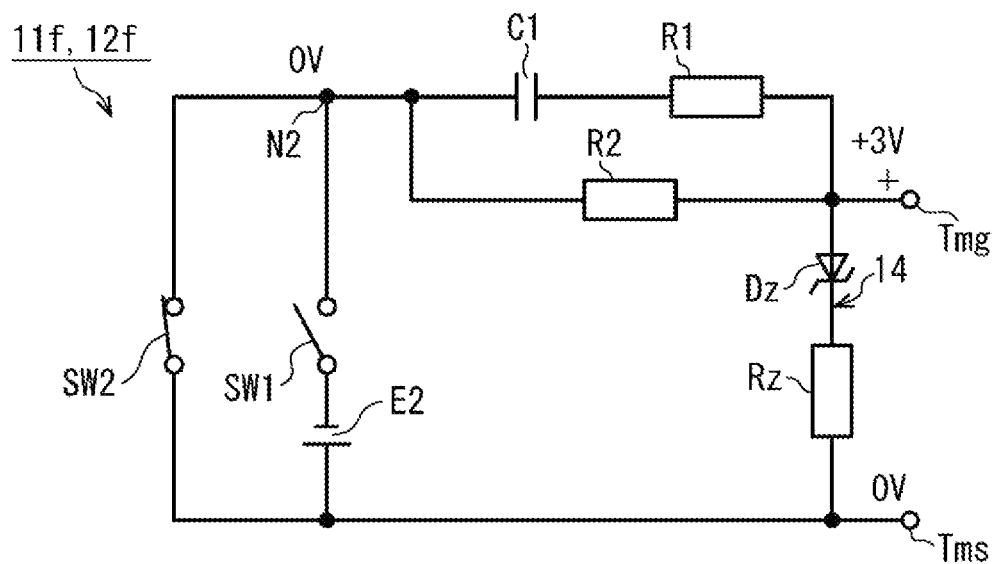
FIG. 26B is an operation explanatory diagram of the above control system.

Note that, at the time of turning on dual-gate bidirectional switch 1, as shown in FIG. 26B, controller 13 turns off first switch SW1 and turns on second switch SW2. As a result, because first gate drive circuit 1 if can discharge a part of the positive charge of capacitor C1 to first gate G1, first gate voltage $V_{G1S1}$ can be temporarily set to first positive voltage VP1 (for example, 3 V) even when the potential at node N2 between first switch SW1 and second switch SW2 is 0 V. Further, because second gate drive circuit 12f can discharge a part of the positive charge of capacitor C1 to second gate G2, second gate voltage $V_{G2S2}$ can be temporarily set to second positive voltage VP2 (for example, 3 V).

Accordingly, similarly to control system 10 according to the exemplary embodiment, control system 10 according to the eleventh modification can suppress the current collapse of dual-gate bidirectional switch 1.

Because control system 10 according to the eleventh modification only needs to include negative power supply E2 as a power supply, the cost can be reduced as compared with control system 10 according to the exemplary embodiment.

Figure 27:
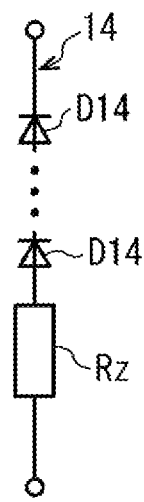
FIG. 27 is a circuit diagram showing another configuration example of the clamp circuit.

Clamp circuit 14 is not limited to a circuit using Zener diode Dz, and for example, may be configured by connecting a plurality of diodes D14 in series as shown in FIG. 27. In the clamp circuit shown in FIG. 27, among the plurality of diodes D14, the cathode of diode D14 closest in the circuit to output terminal Tmg is connected to output terminal Tmg, and the anode of diode D14 closest in the circuit to output terminal Tms is connected to output terminal Tms via resistor Rz.

(5.4.9) Twelfth Modification

An entire circuit configuration of control system 10 according to a twelfth modification of the exemplary embodiment is substantially the same as that of control system 10 (see FIG. 1) according to the exemplary embodiment, and thus illustration and description thereof are omitted.

Figure 28:
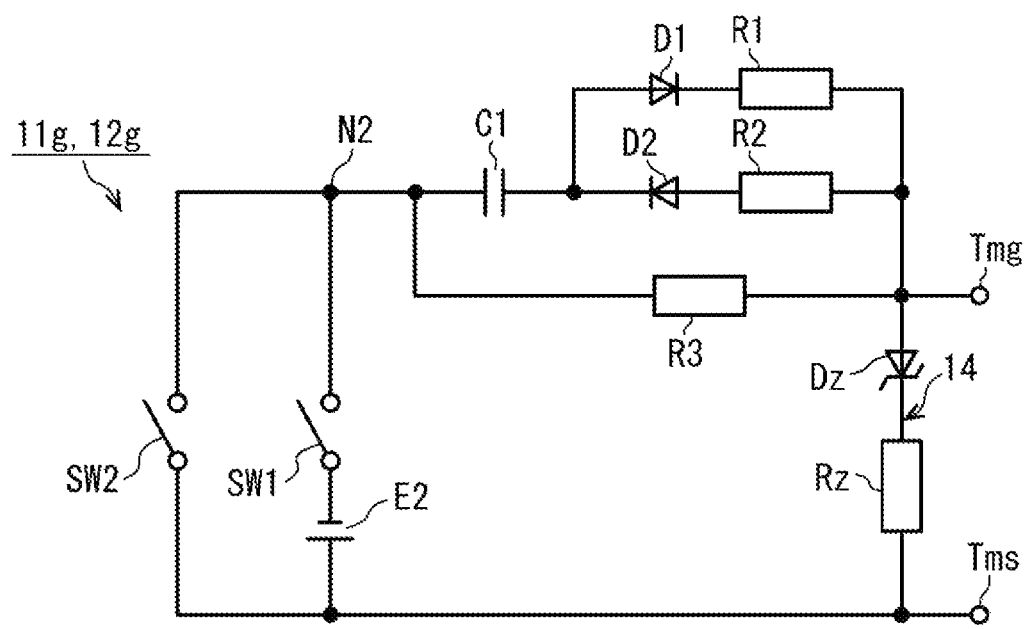
FIG. 28 is a circuit diagram of a first gate drive circuit and a second gate drive circuit in a control system according to a twelfth modification of the exemplary embodiment.

Control system 10 according to the twelfth modification is different from control system 10 shown in FIGS. 1, 2A, and 2B in including first gate drive circuit 11g and second gate drive circuit 12g as shown in FIG. 28 instead of first gate drive circuit 11 and second gate drive circuit 12 in control system 10 according to the exemplary embodiment shown in FIGS. 1, 2A, and 2B. First gate drive circuit 11g has the same configuration as second gate drive circuit 12g. In each of first gate drive circuit 11g and second gate drive circuit 12g, the same components as those of first gate drive circuit 11 and second gate drive circuit 12 are denoted by the same reference numerals, and the description thereof is appropriately omitted.

Each of first gate drive circuit 11g and second gate drive circuit 12g has a pair of output terminals Tmg and Tms. Each of first gate drive circuit 11g and second gate drive circuit 12g includes a series circuit of negative power supply E2, first switch SW1, capacitor C1, first diode D1, and first resistor R1, which are connected between the pair of output terminals Tmg and Tms. Further, each of first gate drive circuit 11g and second gate drive circuit 12g includes a series circuit of second diode D2 and second resistor R2, the series circuit being connected in parallel to a series circuit of first diode D1 and first resistor R1. Further, each of first gate drive circuit 11g and second gate drive circuit 12g includes third resistor R3 connected in parallel to a series circuit of capacitor C1, first diode D1, and first resistor R1. In each of first gate drive circuit 11g and second gate drive circuit 12g, the anode of first diode D1 is connected to capacitor C1, and the cathode of second diode D2 is connected to capacitor C1. In each of first gate drive circuit 11g and second gate drive circuit 12g, the resistance value of first resistor R1 is smaller than the resistance value of second resistor R2.

Control system 10 further includes clamp circuits 14 respectively corresponding to first gate drive circuit 11g and second gate drive circuit 12g. Each of two clamp circuits 14 is connected between the pair of output terminals Tmg and Tms. Clamp circuit 14 corresponding to first gate drive circuit 11g is connected between first gate G1 and first source S1, and clamps the voltage between first gate G1 and first source S1. Clamp circuit 14 corresponding to second gate drive circuit 12g is connected between second gate G2 and second source S2, and clamps the voltage between second gate G2 and second source S2.

Clamp circuit 14 includes, for example, a series circuit of Zener diode Dz and resistor Rz. The anode of Zener diode Dz is connected to output terminal Tmg, and the cathode thereof is connected to output terminal Tms via resistor Rz.

Controller 13 controls first switch SW1 and second switch SW2.

In control system 10 according to the twelfth modification, at the time of turning on dual-gate bidirectional switch 1, in first gate drive circuit 11g, first positive voltage VP1 can be applied by charging first gate G1 through first diode D1, and in second gate drive circuit 12g, second positive voltage VP2 can be applied by charging second gate G2 through first diode D1.

In addition, control system 10 according to the twelfth modification maintains first gate voltage $V_{G1S1}$ of first gate G1 at first voltage V1 (>first threshold voltage Vth1) through third resistor R3 of first gate drive circuit 11g after dual-gate bidirectional switch 1 is turned on. At the same time, second gate voltage $V_{G2S2}$ of second gate G2 is maintained at second voltage V2 (>second threshold voltage Vth2) through third resistor R3 of second gate drive circuit 12g. Thus, dual-gate bidirectional switch 1 can be maintained in the steady ON state. Therefore, by increasing the resistance value of third resistor R3 of first gate drive circuit 11g to reduce gate current Ig flowing through first gate G1, the power loss in first gate G1 can be reduced. In addition, by increasing the resistance value of third resistor R3 of second gate drive circuit 12g to reduce gate current Ig flowing through second gate G2, the power loss in second gate G2 can be reduced.

At the time of turning off dual-gate bidirectional switch 1, controller 13 turns on first switch SW1 of each of first gate drive circuit 11g and second gate drive circuit 12g. By setting gate voltage $V_{G1S1}$ of first gate G1 and gate voltage $V_{G2S2}$ of second gate G2 when dual-gate bidirectional switch 1 is off are set to Vgoff, gate voltage Vgoff is clamped by clamp circuit 14. Here, Vgoff is smaller than first threshold voltage Vth1 and second threshold voltage Vth2.

Further, at the time of turning off dual-gate bidirectional switch 1, the charge of first gate G1 can be discharged through second diode D2 of first gate drive circuit 11g, and the charge of second gate G2 can be discharged through second diode D2 of second gate drive circuit 12g.

Accordingly, similarly to control system 10 according to the exemplary embodiment, control system 10 according to the twelfth modification can suppress the current collapse of dual-gate bidirectional switch 1.

Because control system 10 according to the twelfth modification only needs to include negative power supply E2 as a power supply, the cost can be reduced as compared with control system 10 according to the exemplary embodiment.

Further, in control system 10 according to the twelfth modification, in first gate drive circuit 11g, the parallel circuit in which the series circuit of first diode D1 and first resistor R1 is connected in parallel to the series circuit of second diode D2 and second resistor R2 is connected to capacitor C1. Therefore, the path for applying first positive voltage VP1 to first gate G1 and the path for adjusting the turn-off speed can be separated, and the magnitude of first positive voltage VP1 and the switch loss at the time of turn-off can be controlled independently.

Further, in control system 10 according to the twelfth modification, in second gate drive circuit 12g, the parallel circuit including the series circuit of first diode D1 and first resistor R1 and the series circuit of second diode D2 and second resistor R2 is connected to capacitor C1. Therefore, the path for applying second positive voltage VP2 to second gate G2 and the path for adjusting the turn-off speed can be separated, and the magnitude of second positive voltage VP2 and the switch loss at the time of turn-off can be controlled independently.

Note that control system 10 according to the twelfth modification may employ a configuration in which resistor Rz is connected to the pair of output terminals Tmg and Tms instead of connecting the series circuit of Zener diode Dz and resistor Rz thereto.

(5.4.10) Thirteenth Modification

An entire circuit configuration of control system 10 according to a thirteenth modification of the exemplary embodiment is substantially the same as that of control system 10 (see FIG. 1) according to the exemplary embodiment, and thus illustration and description thereof are omitted.

Figure 29:
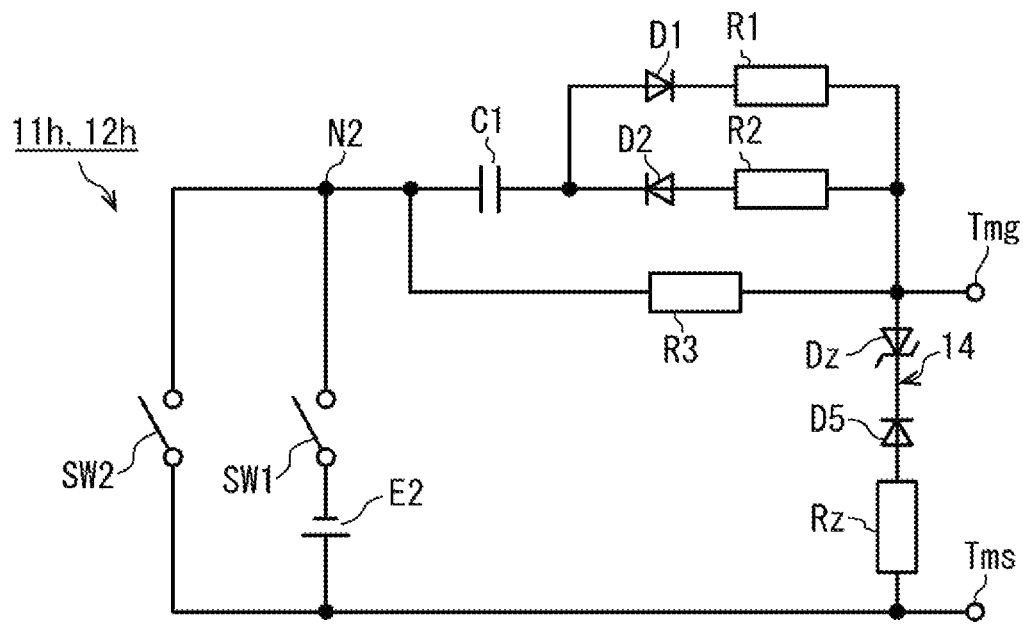
FIG. 29 is a circuit diagram of a first gate drive circuit and a second gate drive circuit in a control system according to a thirteenth modification of the exemplary embodiment.

As shown in FIG. 29, control system 10 according to the thirteenth modification is different from control system 10 according to the twelfth modification in that clamp circuit 14 corresponding to each of first gate drive circuit 11h and second gate drive circuit 12h includes diode D5 connected between Zener diode Dz and resistor Rz in a direction opposite to Zener diode Dz. In clamp circuit 14, the cathode of diode D5 is connected to the cathode of Zener diode Dz, and the anode of diode D5 is connected to resistor Rz. In first gate drive circuit 11h, the anode of Zener diode Dz is connected to first gate G1, the cathode of diode D5 is connected to the cathode of Zener diode Dz, and the anode of diode D5 is connected to first source S1. In second gate drive circuit 12h, the anode of Zener diode Dz is connected to second gate G2, the cathode of diode D5 is connected to the cathode of Zener diode Dz, and the anode of diode D5 is connected to second source S2.

In the control system 10 according to the thirteenth modification, because clamp circuit 14 corresponding to first gate drive circuit 11h includes diode D5, at the time of turning on dual-gate bidirectional switch 1, a part of gate current Ig can be suppressed from leaking through Zener diode Dz when first positive voltage VP1 is applied from first gate drive circuit 11h to first gate G1, and first positive voltage VP1 can be easily increased. Further, in the control system 10 according to the thirteenth modification, because clamp circuit 14 corresponding to second gate drive circuit 12h includes diode D5, at the time of turning on dual-gate bidirectional switch 1, a part of gate current Ig can be suppressed from leaking through Zener diode Dz when second positive voltage VP2 is applied from second gate drive circuit 12h to second gate G2, and second positive voltage VP2 can be easily increased.

Note that control system 10 according to the thirteenth modification may employ a configuration in which a series circuit of diode D5 and resistor Rz is connected to the pair of output terminals Tmg and Tms instead of connecting the series circuit of Zener diode Dz, diode D5, and resistor Rz thereto.

(5.4.11) Fourteenth Modification

An entire circuit configuration of control system 10 according to a fourteenth modification of the exemplary embodiment is substantially the same as that of control system 10 (see FIG. 1) according to the exemplary embodiment, and thus illustration and description thereof are omitted.

Figure 30:
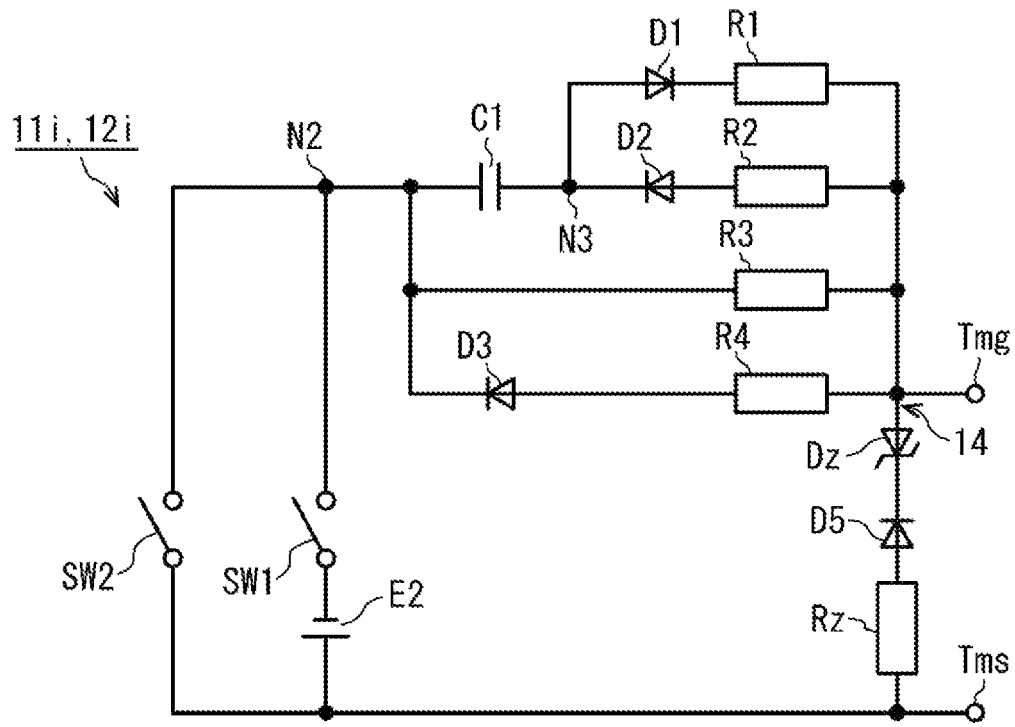
FIG. 30 is a circuit diagram of a first gate drive circuit and a second gate drive circuit in a control system according to a fourteenth modification of the exemplary embodiment.

As shown in FIG. 30, control system 10 according to the fourteenth modification is different from control system 10 according to the thirteenth modification in that each of first gate drive circuit 11i and second gate drive circuit 12i further includes a series circuit of third diode D3 and fourth resistor R4, the series circuit being connected in parallel to the series circuit of capacitor C1, second diode D2, and second resistor R2. In each of first gate drive circuit 11i and second gate drive circuit 12i, the cathode of third diode D3 is connected to capacitor C1, and the anode of third diode D3 is connected to output terminal Tmg via resistor R4. The series circuit of third diode D3 and fourth resistor R4 is connected in parallel to third resistor R3.

In control system 10 according to the fourteenth modification, because first gate drive circuit 11i includes the series circuit of diode D3 and resistor R4, the charge of first gate G1 can be discharged even through the path not passing through capacitor C1 at the time of turning off the dual-gate bidirectional switch 1. Therefore, for example, even when the capacitance of capacitor C1 is smaller than the capacitance of first gate G1, control system 10 according to the fourteenth modification can discharge the charge of first gate G1 and can easily control the turn-off speed. In first gate drive circuit 11i, by making the resistance value of resistor R4 smaller than the resistance value of second resistor R2, the gate discharge current flowing through resistor R4 can be made larger than the gate discharge current flowing through second resistor R2, and the turn-off speed can be increased.

Further, in control system 10 according to the fourteenth modification, because second gate drive circuit 12i includes the series circuit of diode D3 and resistor R4, the charge of second gate G2 can be discharged even through the path not passing through capacitor C1 at the time of turning off the dual-gate bidirectional switch 1. Therefore, for example, even when the capacitance of capacitor C1 is smaller than the capacitance of second gate G2, control system 10 according to the fourteenth modification can discharge the charge of second gate G2 and can easily control the turn-off speed. In second gate drive circuit 12i, by making the resistance value of resistor R4 smaller than the resistance value of second resistor R2, the gate discharge current flowing through resistor R4 can be made larger than the gate discharge current flowing through second resistor R2, and the turn-off speed can be increased.

In each of first gate drive circuit 11i and second gate drive circuit 12i, the resistance value of first resistor R1 is smaller than the resistance value of third resistor R3. The resistance value of resistor R4 is smaller than the resistance value of second resistor R2. The resistance value of second resistor R2 is smaller than the resistance value of third resistor R3.

In addition, in control system 10 according to the fourteenth modification, because the current does not flow through resistor R4 at the time of turning on dual-gate bidirectional switch 1, resistor R4 can be prevented from causing the power loss of dual-gate bidirectional switch 1 in the steady ON state.

In addition, in control system 10 according to the fourteenth modification, in order for Zener diode Dz to operate at a constant voltage in clamp circuit 14 corresponding to each of first gate drive circuit 11i and second gate drive circuit 12i, a constant current needs to continuously flow in Zener diode Dz, but capacitor C1 cannot keep a direct current to flow continuously. However, because each of first gate drive circuit 11i and second gate drive circuit 12i includes the series circuit of diode D3 and resistor R4, the constant current can be continuously flowed through Zener diode Dz in a closed circuit including negative power supply E2, resistor Rz, diode D5, Zener diode Dz, resistor R4, diode D3, and first switch SW1, and Zener diode Dz can be operated at a constant voltage.

(5.4.12) Fifteenth Modification

An entire circuit configuration of control system 10 according to a fifteenth modification of the exemplary embodiment is substantially the same as that of control system 10 (see FIG. 1) according to the exemplary embodiment, and thus illustration and description thereof are omitted.

Figure 31:
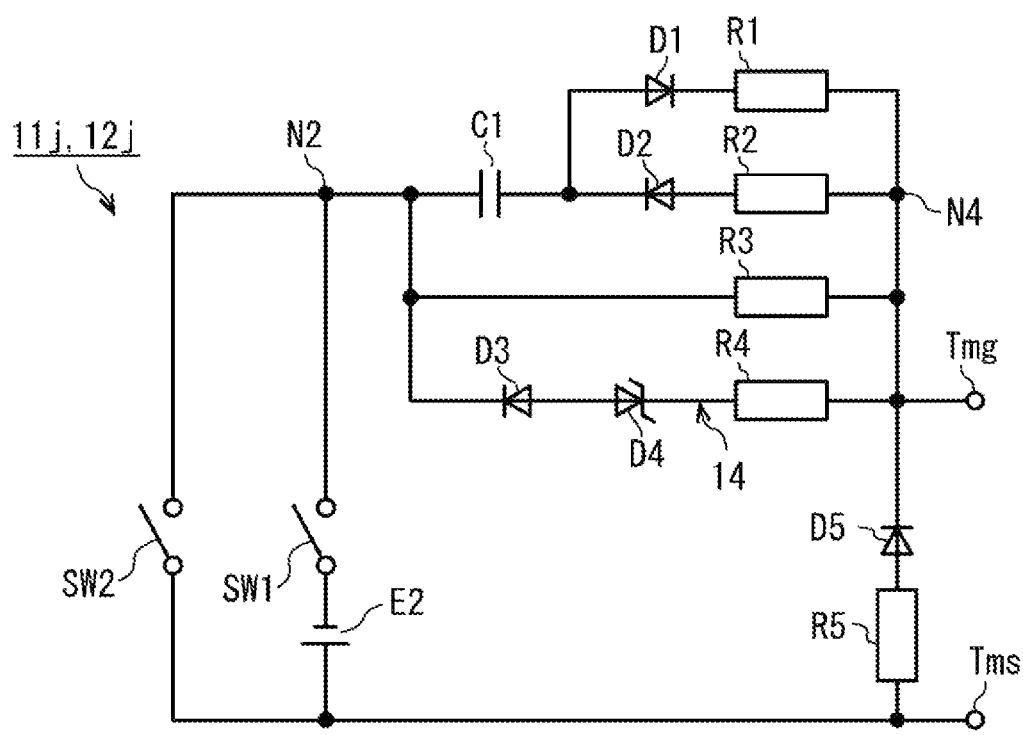
FIG. 31 is a circuit diagram of a first gate drive circuit and a second gate drive circuit in a control system according to a fifteenth modification of the exemplary embodiment.

Control system 10 according to the fifteenth modification is different from control system 10 according to the fourteenth modification in that each of first gate drive circuit 11j and second gate drive circuit 12j includes clamp circuit 14 as shown in FIG. 31. In each of first gate drive circuit 11j and second gate drive circuit 12j, clamp circuit 14 includes Zener diode D4 connected between third diode D3 and resistor R4. Further, in each of first gate drive circuit 11j and second gate drive circuit 12j, a series circuit of diode D5 and resistor R5 is connected between a pair of output terminals Tmg and Tms.

In each of first gate drive circuit 11j and second gate drive circuit 12j, clamp circuit 14 clamps the voltage between node N2 and node N4 when dual-gate bidirectional switch 1 is in the OFF state. Node N4 is a point at which first resistor R1 is connected to second resistor R2. Therefore, in each of first gate drive circuit 11j and second gate drive circuit 12j, electric charge can be accumulated in capacitor C1 when dual-gate bidirectional switch 1 is in the OFF state. Therefore, at the time of turning on dual-gate bidirectional switch 1, first positive voltage VP1 can be applied between first gate G1 and first source S1, and meanwhile, second positive voltage VP2 can be applied between second gate G2 and second source S2.

Accordingly, similarly to control system 10 according to the exemplary embodiment, control system 10 according to the fifteenth modification can suppress the current collapse.

Clamp circuit 14 is not limited to the case of being constituted of Zener diode D4, and may be constituted of a series circuit of a plurality of diodes (for example, a Schottky diode).

The exemplary embodiment described above is merely one of various exemplary embodiments of the present disclosure. The exemplary embodiment described above can be variously changed according to a design and the like as long as the object of the present disclosure can be achieved.

For example, dual-gate bidirectional switch 1 may have a recess structure immediately below each of first gate G1 and second gate G2 on surface 115 of second nitride semiconductor layer 105.

Each of first p-type layer 161 and second p-type layer 162 in dual-gate bidirectional switch 1 is not limited to the p-type AlGaN layer, and may be, for example, a p-type GaN layer or a p-type metal oxide semiconductor layer. The p-type metal oxide semiconductor layer is, for example, a NiO layer. The NiO layer may contain, for example, as an impurity, at least one alkali metal selected from the group of lithium, sodium, potassium, rubidium, and cesium. Further, the NiO layer may contain, for example, transition metal such as silver or copper that becomes monovalent when added as an impurity.

Each dual-gate bidirectional switch 1 may include one or more nitride semiconductor layers between buffer layer 103 and first nitride semiconductor layer 104. Buffer layer 103 is not limited to a single layer structure, and may have, for example, a superlattice structure.

Further, substrate 102 in dual-gate bidirectional switch 1 is not limited to the silicon substrate, and may be, for example, a GaN substrate, a SiC substrate, a sapphire substrate, or the like.

(5.4.13) Sixteenth Modification

Figure 32:
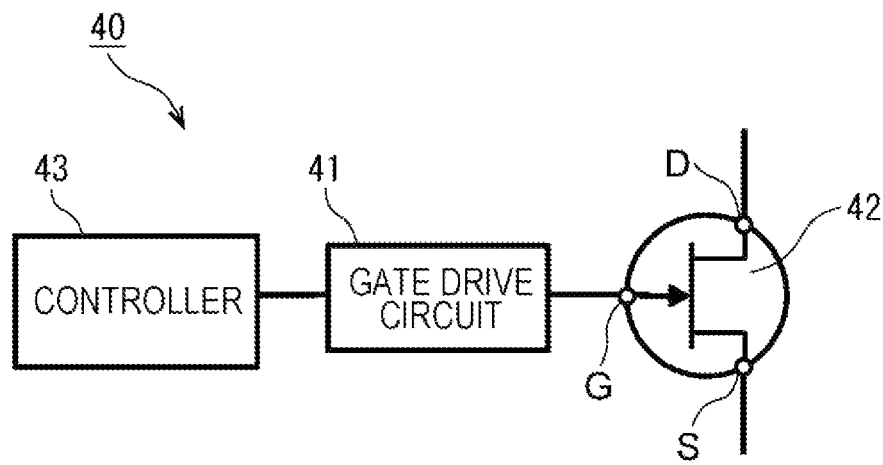
FIG. 32 is a circuit diagram of a switch system including a control system according to a sixteenth modification of the exemplary embodiment.
Figure 33:
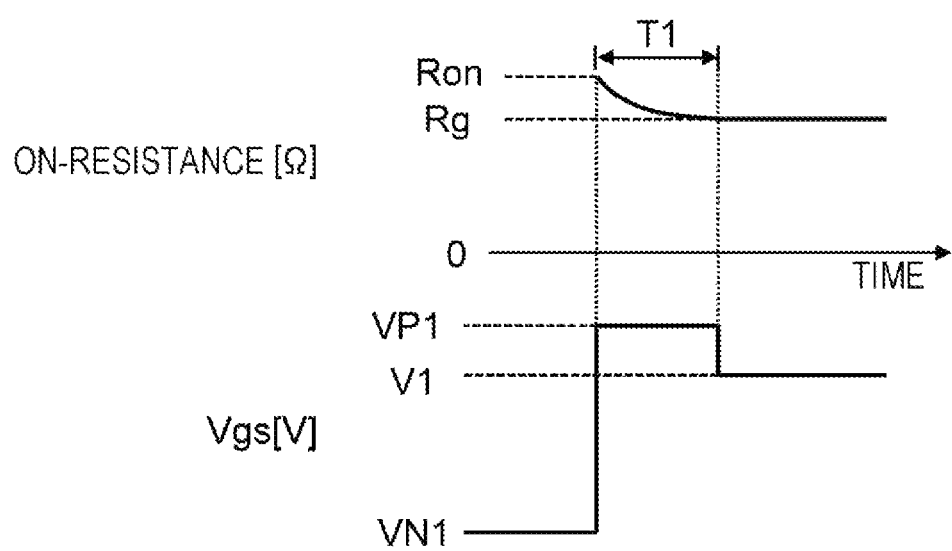
FIG. 33 is a characteristic diagram of on-resistance of the control system according to the sixteenth modification of the exemplary embodiment and a timing chart for explaining an operation of the control system.

FIG. 32 shows a circuit configuration of a control system according to a sixteenth modification of the exemplary embodiment. Control system 40 includes controller 43, gate drive circuit 41, and unidirectional switching element 42 including a nitride semiconductor element. Unidirectional switching element 42 according to the sixteenth modification is different from the bidirectional switch element in that only one gate part including a pn junction is provided. Further, control system 40 according to the sixteenth modification is different from control system 10 according to the first exemplary example and the first to fifteenth modifications in that one gate drive circuit 41 is provided. Gate drive circuit 41 is connected between gate G and source S. Controller 43 controls gate drive circuit 41. In the case where any one of the drive circuits according to the first exemplary example to the first to fifteenth modification is applied to gate drive circuit 41, first positive voltage VP1 can be applied between gate G and source S at the time of turning on unidirectional switching element 42. Accordingly, the current collapse can be suppressed. Specifically, in the case where the gate drive circuit of FIG. 25 is applied, characteristics as shown in FIG. 33 is exhibited. FIG. 33 is a characteristic diagram of on-resistance of the control system 40 according to the sixteenth modification of the exemplary embodiment and a timing chart for explaining an operation of control system 40. In FIG. 33, when unidirectional switching element 42 is turned on, the value of the on-resistance between gate G and source S becomes Ron. Thereafter, the value of the on-resistance gradually decreases, and the resistance value becomes Rg (Rg<R1) and becomes constant after a predetermined time (first period T1) has elapsed from the time when the unidirectional switching element 42 is turned on. At the time of turning on unidirectional switching element 42, when the potential of source S is lower than the potential of drain D, controller 43 controls gate drive circuit 41 as follows. That is, controller 43 applies first positive voltage VP1 for first period T1 between gate G and source S from gate drive circuit 41, and applies voltage V1 smaller than first positive voltage VP1 after first period T1 has elapsed.

Figure 34:
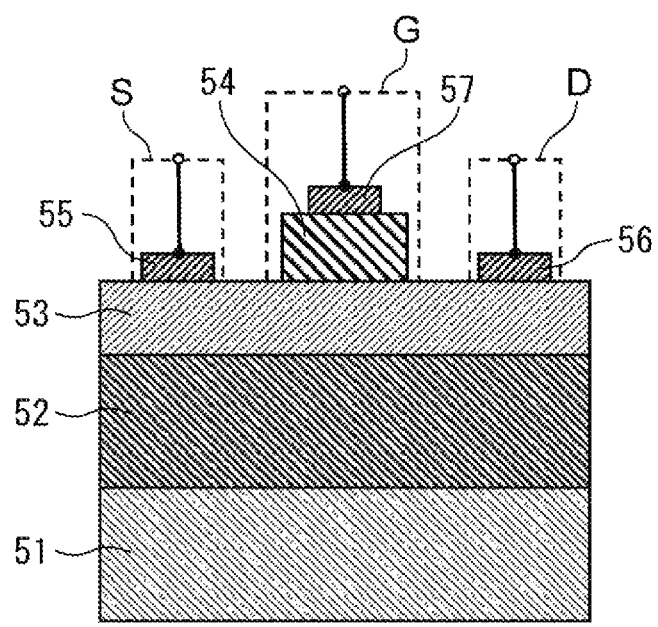
FIG. 34 is a sectional view of a field effect transistor used in the control system according to the sixteenth modification of the exemplary embodiment.

The structure of unidirectional switching element 42 is described with reference to a sectional view shown in FIG. 34. FIG. 34 is a sectional view of unidirectional switching element 42 taken along a plane perpendicular to substrate 51 and including source electrode 55, drain electrode 56, and gate electrode 57. Unidirectional switching element 42 is a normally-on single-gate field effect transistor having gate G, source S, and drain D. Unidirectional switching element 42 includes, for example, substrate 51, first nitride semiconductor layer 52, second nitride semiconductor layer 53, source electrode 55, gate electrode 57, drain electrode 56, and p-type layer 54. First nitride semiconductor layer 52 is disposed on substrate 51. Second nitride semiconductor layer 53 is disposed on first nitride semiconductor layer 52. In addition, second nitride semiconductor layer 53 has a larger bandgap than first nitride semiconductor layer 52. Source electrode 55, gate electrode 57, and drain electrode 56 are disposed on second nitride semiconductor layer 53. P-type layer 54 is interposed between gate electrode 57 and second nitride semiconductor layer 53. Gate G includes gate electrode 57 and p-type layer 54. Source S includes source electrode 55, and drain D includes drain electrode 56. First nitride semiconductor layer 52 and p-type layer 54 is made of, for example, GaN or AlGaN. Second nitride semiconductor layer 53 is made of, for example, AlGaN. Note that AlGaN refers to a nitride having a composition of $Al_xGa_{1-x}N$ ($0<x<1$). As first nitride semiconductor layer 52, second nitride semiconductor layer 53, and the p-type layer, a nitride composed a composition of $Al_xGa_{1-x-y}In_yN$ ($0 \le x \le 1$, $0 \le y \le 1$) may be used, x and y each having a value determined by each layer. In addition, substrate 51 is made of, for example, a Si substrate. Note that substrate 51 is not limited to the Si substrate, and may be, for example, a GaN substrate, a SiC substrate, a sapphire substrate, or the like.

(Aspects)

The following aspects are disclosed based on the above-described exemplary embodiments and the like in the present description.

Control system (10) according to a first aspect is a control system for normally-on dual-gate bidirectional switch (1). Dual-gate bidirectional switch (1) includes first gate (G1), first source (S1) corresponding to first gate (G1), second gate (G2), and second source (S2) corresponding to second gate (G2). Control system (10) includes first gate drive circuit (11; 11a; 11b; 11c; 11d; 11e; 11f; 11g; 11h; 11i; 11j), second gate drive circuit (12; 12a; 12b; 12c; 12d; 12e; 12f; 12g; 12h; 12i; 12j), and controller (13). First gate drive circuit (11; 11a; 11b; 11c; 11d; 11e; 11f; 11g; 11h; 11i; 11j) is connected between first gate (G1) and first source (S1). Second gate drive circuit (12; 12a; 12b; 12c; 12d; 12e; 12f; 12g; 12h; 12i; 12j) is connected between second gate (G2) and second source (S2). Controller (13) controls first gate drive circuit (11; 11a; 11b; 11c; 11d; 11e; 11f; 11g; 11h; 11i; 11j) and second gate drive circuit (12; 12a; 12b; 12c; 12d; 12e; 12f; 12g; 12h; 12i; 12j). At the time of turning on dual-gate bidirectional switch (1), when the potential of first source (S1) is lower than the potential of second source (S2), controller (13) controls first gate drive circuit (11; 11a; 11b; 11c; 11d; 11e; 11f; 11g; 11h; 11i; 11j) as follows. That is, controller (13) applies first positive voltage (VP1) between first gate (G1) and first source (S1) from first gate drive circuit (11; 11a; 11b; 11c; 11d; 11e; 11f; 11g; 11h; 11i; 11j) for first period (T1), and applies voltage (V1) smaller than first positive voltage (VP1) after first period (T1) has elapsed.

Control system (10) according to the first aspect can suppress the current collapse of normally-on dual-gate bidirectional switch (1).

In control system (10) according to a second aspect, in the first aspect, at the time of turning on dual-gate bidirectional switch (1), when the potential of first source (S1) is lower than the potential of second source (S2), controller (13) controls second gate drive circuit (12; 12a; 12b; 12c; 12d; 12e; 12f; 12g; 12h; 12i; 12j) as follows. That is, controller (13) applies second positive voltage (VP2) between second gate (G2) and second source (S2) from second gate drive circuit (12; 12a; 12b; 12c; 12d; 12e; 12f; 12g; 12h; 12i; 12j) for second period (T2), and applies voltage (V2) smaller than second positive voltage (VP2) after second period (T2) has elapsed.

Control system (10) according to the second aspect can suppress the current collapse of normally-on dual-gate bidirectional switch (1).

In control system (10) according to a third aspect, in the first or second aspect, controller (13) matches a timing shown in (i) below and a timing shown in (ii) below at the time of turning on dual-gate bidirectional switch (1).

(i) The timing of starting the application of first positive voltage (VP1) between first gate (G1) and first source (S1) from first gate drive circuit (11; 11a; 11b; 11c; 11d; 11e; 11f; 11g; 11h; 11i; 11j).

(ii) The timing of starting the application of a voltage higher than a threshold voltage between second gate (G2) and second source (S2) from second gate drive circuit (12; 12a; 12b; 12c; 12d; 12e; 12f; 12g; 12h; 12i; 12j).

In control system (10) according to a fourth aspect, in the first or second aspect, at the time of turning on dual-gate bidirectional switch (1), when the potential of first source (S1) is lower than the potential of second source (S2), controller (13) controls first gate drive circuit (11; 11a; 11b; 11c; 11d; 11e; 11f; 11g; 11h; 11i; 11j) and second gate drive circuit (12) as follows. That is, control system (10) starts the application of first positive voltage (VP1) between first gate (G1) and first source (S1) from first gate drive circuit (11; 11a; 11b; 11c; 11d; 11e; 11f; 11g; 11h; 11i; 11j)), and thereafter, starts the application of a voltage higher than a threshold voltage between second gate (G2) and second source (S2) from second gate drive circuit (12) within first period (T1).

In control system (10) according to the fourth aspect, holes (h⁺) are easily injected from first gate (G1) and the current collapse can be suppressed.

In control system (10) according to a fifth aspect, in the second aspect, at the time of turning on dual-gate bidirectional switch (1), when the potential of second source (S2) is higher than the potential of first source (S1), controller (13) controls first gate drive circuit (11; 11a; 11b; 11c; 11d; 11e; 11f; 11g; 11h; 11i; 11j) and second gate drive circuit (12) as follows. That is, controller (13) starts the application of second positive voltage (VP2) between second gate (G2) and second source (S2) from second gate drive circuit (12), and thereafter, starts the application of first positive voltage (VP1) within second period (T2) between first gate (G1) and first source (S1) from first gate drive circuit (11; 11a; 11b; 11c; 11d; 11e; 11f; 11g; 11h; 11i; 11j).

In control system 10 according to the fifth aspect, because negative charges near second gate (G2) having a relatively high potential among first gate (G1) and second gate (G2) are suppressed by injection of holes from second gate (G2), and thereafter, first positive voltage (VP1) is applied between first gate (G1) having a relatively low potential and first source (S1), the current collapse can be further suppressed.

In control system (10) according to a sixth aspect, in any one of the first to fifth aspects, dual-gate bidirectional switch (1) includes: substrate (102); first nitride semiconductor layer (104); second nitride semiconductor layer (105); first source electrode (171), first gate electrode (181), second gate electrode (182), and second source electrode (172); first p-type layer (161); and second p-type layer (162). First nitride semiconductor layer (104) is disposed on substrate (102). Second nitride semiconductor layer (105) is disposed on first nitride semiconductor layer (104). Second nitride semiconductor layer (105) has a larger bandgap than first nitride semiconductor layer (104). First source electrode (171), first gate electrode (181), second gate electrode (182), and second source electrode (172) are disposed on second nitride semiconductor layer (105). First p-type layer (161) is interposed between first gate electrode (181) and second nitride semiconductor layer (105). Second p-type layer (162) is interposed between second gate electrode (182) and second nitride semiconductor layer (105). First gate (G1) includes first gate electrode (181) and first p-type layer (161). Second gate (G2) includes second gate electrode (182) and second p-type layer (162).

In control system (10) according to a seventh aspect, in any one of the first to fifth aspects, first gate drive circuit (11) includes a first series circuit, second switch (SW2), and a second series circuit, which are connected between first gate (G1) and first source (S1). The first series circuit includes positive power supply (E1) and first switch (SW1). Second switch (SW2) is connected between first gate (G1) and first source (S1). The second series circuit includes negative power supply (E2) and third switch (SW3) and is connected between first gate (G1) and first source (S1). Controller (13) controls first switch (SW1), second switch (SW2), and third switch (SW3).

In control system (10) according to the seventh aspect, a circuit design of first gate drive circuit (11) becomes easy.

In control system (10) according to an eighth aspect, in the sixth aspect, first gate drive circuit (11a) includes a first series circuit, a second series circuit, and a third series circuit, which are respectively connected between first gate (G1) and first source (S1). The first series circuit is a series circuit including positive power supply (E1), first switch (SW1), and first resistor (R1). The second series circuit is a series circuit including positive power supply (E1), second switch (SW2), and second resistor (R2). The third series circuit is a series circuit including negative power supply (E2), third switch (SW3), and third resistor (R3). A resistance value of first resistor (R1) is smaller than a resistance value of second resistor (R2). Controller (13) controls first switch (SW1), second switch (SW2), and third switch (SW3).

In control system (10) according to the eighth aspect, a circuit design of first gate drive circuit (11) becomes easy.

In control system (10) according to a ninth aspect, in the sixth aspect, first gate drive circuit (11b) includes a first series circuit, second resistor (R2), and a second series circuit, which are respectively connected between first gate (G1) and first source (S1). The first series circuit is a series circuit including positive power supply (E1), first switch (SW1), capacitor (C1), and first resistor (R1). Second resistor (R2) is connected in parallel to a series circuit of capacitor (C1) and first resistor (R1). The second series circuit is a series circuit including negative power supply (E2), second switch (SW2), and third resistor (R3). A resistance value of first resistor (R1) is smaller than a resistance value of second resistor (R2). Controller (13) controls first switch (SW1) and second switch (SW2).

In a control system (10) according to the ninth aspect, first period (T1) in which first positive voltage (VP1) is applied is determined by capacitance of capacitor (C1).

In control system (10) according to a tenth aspect, in the sixth aspect, first gate drive circuit (11c) includes a first series circuit, a second series circuit, and second resistor (R2), which are respectively connected between first gate (G1) and first source (S1). The first series circuit is a series circuit of positive power supply (E1), first switch (SW1), capacitor (C1), and first resistor (R1). The second series circuit is a series circuit of negative power supply (E2) and second switch (SW2) and is connected in parallel to a series circuit of positive power supply (E1) and first switch (SW1). Second resistor (R2) is connected in parallel to a series circuit of capacitor (C1) and first resistor (R1). A resistance value of first resistor (R1) is smaller than a resistance value of second resistor (R2). Controller (13) controls first switch (SW1) and second switch (SW2).

The control system (10) according to the tenth aspect can achieve downsizing and cost reduction as compared with control system (10) according to the ninth aspect.

In control system (10) according to an eleventh aspect, in the sixth aspect, first gate drive circuit (11d) includes a first series circuit, a second series circuit, second resistor (R2), and a third series circuit, which are respectively connected between first gate (G1) and first source (S1). The first series circuit is a series circuit including positive power supply (E1), first switch (SW1), first diode (D1), capacitor (C1), and first resistor (R1). The second series circuit is a series circuit of negative power supply (E2) and second switch (SW2) and is connected in parallel to a series circuit of positive power supply (E1) and first switch (SW1). Second resistor (R2) is connected in parallel to a series circuit of first diode (D1), capacitor (C1), and first resistor (R1). The third series circuit is a series circuit including second diode (D2) and third resistor (R3) and is connected in parallel to a series circuit of first diode (D1), capacitor (C1), and first resistor (R1). An anode of first diode (D1) is connected to a positive electrode of positive power supply (E1) and a negative electrode of negative power supply (E2). A cathode of second diode (D2) is connected to the positive electrode of positive power supply (E1) and the negative electrode of negative power supply (E2). A resistance value of first resistor (R1) is smaller than a resistance value of second resistor (R2). A resistance value of third resistor (R3) is smaller than a resistance value of second resistor (R2). Controller (13) controls first switch (SW1) and second switch (SW2).

Control system (10) according to the eleventh aspect can suppress the power loss at first gate (G1) of dual-gate bidirectional switch (1).

In control system (10) according to a twelfth aspect, in the sixth aspect, first gate drive circuit (11e) includes a first series circuit, second switch (SW2), second resistor (R2), and third resistor (R3), which are respectively connected between first gate (G1) and first source (S1). The first series circuit is a series circuit of negative power supply (E2), first switch (SW1), capacitor (C1), and first resistor (R1). Second switch (SW2) is connected in parallel to a series circuit of negative power supply (E2) and first switch (SW1). Second resistor (R2) is connected in parallel to a series circuit of capacitor (C1) and first resistor (R1). Third resistor (R3) is connected between first gate (G1) and first source (S1). A resistance value of first resistor (RI) is smaller than a resistance value of second resistor (R2). Controller (13) controls first switch (SW1) and second switch (SW2).

Control system (10) according to the twelfth aspect can generate first positive voltage (VP1) without using a positive power supply, and can achieve downsizing and cost reduction.

In control system (10) according to a thirteenth aspect, in the sixth aspect, first gate drive circuit (11f) includes a first series circuit, second switch (SW2), and second resistor (R2), which are respectively connected between first gate (G1) and first source (S1). The first series circuit is a series circuit of negative power supply (E2), first switch (SW1), capacitor (C1), and first resistor (R1). Second switch (SW2) is connected in parallel to a series circuit of negative power supply (E2) and first switch (SW1). Second resistor (R2) is connected in parallel to a series circuit of capacitor (C1) and first resistor (R1). A resistance value of first resistor (R1) is smaller than a resistance value of second resistor (R2). Control system (10) further includes clamp circuit (14). Clamp circuit 14 is connected between first gate (G1) and first source (S1), and clamps the voltage between first gate (G1) and first source (S1). Controller (13) controls first switch (SW1) and second switch (SW2).

The control system (10) according to the thirteenth aspect can generate first positive voltage (VP1) without using a positive power supply, and can achieve downsizing and cost reduction.

In control system (10) according to a fourteenth aspect, in the sixth aspect, first gate drive circuit (11g; 11h) includes a first series circuit, second switch (SW2), a second series circuit, and third resistor (R3), which are connected between first gate (G1) and first source (S1). The first series circuit is a series circuit of negative power supply (E2), first switch (SW1), capacitor (C1), first diode (D1), and first resistor (R1). Second switch (SW2) is connected in parallel to a series circuit of negative power supply (E2) and first switch (SW1). The second series circuit is a series circuit of second diode (D2) and second resistor (R2) and is connected in parallel to a series circuit of first diode (D1) and first resistor (R1). Third resistor (R3) is connected in parallel to a series circuit of capacitor (C1), first diode (D1), and first resistor (R1). An anode of first diode (D1) is connected to capacitor (C1). A cathode of second diode (D2) is connected to capacitor (C1). A resistance value of first resistor (R1) is smaller than a resistance value of second resistor (R2). Control system (10) further includes clamp circuit (14). Clamp circuit 14 is connected between first gate (G1) and first source (S1), and clamps the voltage between first gate (G1) and first source (S1). Controller (13) controls first switch (SW1) and second switch (SW2).

A control system (10) according to the fourteenth aspect can generate first positive voltage (VP1) without using a positive power supply, and a circuit design of first gate drive circuit (11g, 11h) becomes easy.

In control system (10) according to a fifteenth aspect, in the fourteenth aspect, clamp circuit (14) includes Zener diode (Dz) and diode (D5). An anode of Zener diode (Dz) is connected to first gate (G1), a cathode of diode (D5) is connected to a cathode of Zener diode (Dz), and an anode of diode (D5) is connected to first source (S1).

Control system (10) according to the fifteenth aspect can suppress a part of the gate current from leaking through Zener diode (Dz) when first positive voltage (VP1) is applied to first gate (G1), and first positive voltage (VP1) can be easily increased.

In control system (10) according to a sixteenth aspect, in the fifteenth aspect, first gate drive circuit (11i) further includes a series circuit of third diode (D3) and fourth resistor (R4), the series circuit being connected in parallel to a series circuit of capacitor (C1), second diode (D2), and second resistor (R2). A cathode of third diode (D3) is connected to capacitor (C1).

In control system (10) according to the sixteenth aspect, the turn-off speed of dual-gate bidirectional switch (1) can be easily controlled.

In control system (10) according to a seventeenth aspect, in the sixth aspect, first gate drive circuit (11j) includes a first series circuit, second switch (SW2), a second series circuit, and third resistor (R3), which are connected between first gate (G1) and first source (S1). The first series circuit is a series circuit of negative power supply (E2), first switch (SW1), capacitor (C1), first diode (D1), and first resistor (R1). Second switch (SW2) is connected in parallel to a series circuit of negative power supply (E2) and first switch (SW1). The second series circuit is a series circuit of second diode (D2) and second resistor (R2) and is connected in parallel to a series circuit of first diode (D1) and first resistor (R1). Third resistor (R3) is connected in parallel to a series circuit of capacitor (C1), first diode (D1), and first resistor (R1). An anode of first diode (D1) is connected to capacitor (C1). A cathode of second diode (D2) is connected to capacitor (C1). A resistance value of first resistor (R1) is smaller than a resistance value of second resistor (R2). First gate drive circuit (11) further includes clamp circuit (14). Clamp circuit (14) is connected in parallel to a series circuit of capacitor (C1), first diode (D1), and first resistor (R1). Controller (13) controls first switch (SW1) and second switch (SW2).

In control system (10) according to the seventeenth aspect, the turn-off speed of dual-gate bidirectional switch (1) can be easily controlled.

In control system (10) according to an eighteenth aspect, in any one of the first and sixth aspects, first gate drive circuit (11) includes a CMOS inverter that can selectively output first positive voltage (VP1) and a negative voltage less than a threshold voltage.

Switch system (20) according to a nineteenth aspect can suppress the current collapse of normally-on dual-gate bidirectional switch (1).

In a control method for a dual-gate bidirectional switch according to a twentieth aspect, dual-gate bidirectional switch (1) is normally-on dual-gate bidirectional switch (1) including first gate (G1), first source (S1) corresponding to first gate (G1), second gate (G2), and second source (S2) corresponding to second gate (G2). In the control method for the dual-gate directional switch, at the time of turning on dual-gate bidirectional switch (1), when the potential of first source (S1) is lower than the potential of second source (S2), first positive voltage (VP1) is applied between first gate (G1) and first source (S1) for first period (T1), and voltage (V1) smaller than first positive voltage (VP1) is applied after first period (T1) has elapsed.

The control method for the dual-gate bidirectional switch according to the nineteenth aspect can suppress the current collapse of normally-on dual-gate bidirectional switch 1.

Control system (40) according to a twentieth aspect is a control system for unidirectional switching element (42). Unidirectional switching element (42) is a normally-on single-gate field effect transistor including gate (G), source(S), and drain (D). Unidirectional switching element (42) includes: substrate (51); first nitride semiconductor layer (52); second nitride semiconductor layer (53); source electrode (55), gate electrode (57), and drain electrode (56); and p-type layer (54). First nitride semiconductor layer (52) is disposed on substrate (51). Second nitride semiconductor layer (53) is disposed on first nitride semiconductor layer (52). In addition, second nitride semiconductor layer (53) has a larger bandgap than first nitride semiconductor layer (52). Source electrode (55), gate electrode (57), and drain electrode (56) are disposed on second nitride semiconductor layer (53). Further, p-type layer (54) is interposed between gate electrode (57) and second nitride semiconductor layer (53). Gate (G) includes gate electrode (57) and p-type layer (52). Source(S) includes source electrode (55), and drain (D) includes drain electrode (56). Control system (40) includes gate drive circuit (43) and controller (41). Gate drive circuit (43) is connected between gate (G) and source(S). Controller (41) controls gate drive circuit (43). At the time of turning on unidirectional switching element (42), when the potential of source(S) is lower than the potential of drain (D), controller (41) applies a first positive voltage for a first period between gate (G) and source(S) from gate drive circuit (43), and applies a voltage smaller than the first positive voltage after the first period has elapsed.

The control system of the twentieth aspect can suppress the current collapse of the unidirectional switch constituted of the normally-on nitride semiconductor.

INDUSTRIAL APPLICABILITY

The control system and the control method for the dual-gate bidirectional switch of the present disclosure can suppress the current collapse. In addition, the control system of the present disclosure can suppress the current collapse of the unidirectional switch constituted of the normally-on nitride semiconductor. That is, the control system and the control method for the dual-gate bidirectional switch of the present disclosure are particularly useful in a normally-on switch.

REFERENCE MARKS IN THE DRAWINGS

1: dual-gate bidirectional switch
G1: first gate
S1: first source
G2: second gate
S2: second source
10, 40: control system
11, 11a, 11b, 11c, 11d, 11e, 11f, 11g, 11h, 11i, 11j, 11r: first gate drive circuit
12, 12a, 12b, 12c, 12d, 12e, 12f, 12g, 12h, 12i, 12j, 12r: second gate drive circuit
13, 43: controller
14: clamp circuit
20: switch system
161: first p-type layer
162: second p-type layer
171: first source electrode
172: second source electrode
181: first gate electrode
182: second gate electrode
C1: capacitor
D1: first diode
D2: second diode
D4, Dz: Zener diode
E1: positive power supply
E2: negative power supply
R1: first resistor
R2: second resistor
R3: third resistor
SW1: first switch
SW2: second switch
SW3: third switch
T1: first period
T2: second period
V1: first voltage
V2: second voltage
VP1: first positive voltage
VP2: second positive voltage
S: source
G: gate
D: drain
41: gate drive circuit
51, 102: substrate
52, 104: first nitride semiconductor layer
53, 105: second nitride semiconductor layer
54: p-type layer
55: source electrode
56: drain electrode
57: gate electrode

The invention claimed is:

1. A control system for a dual-gate bidirectional switch of a normally-on type, the dual-gate bidirectional switch including a first gate, a first source corresponding to the first gate, a second gate, and a second source corresponding to the second gate, the control system comprising:
    a first gate drive circuit connected between the first gate and the first source;
    a second gate drive circuit connected between the second gate and the second source; and
    a controller that controls the first gate drive circuit and the second gate drive circuit, wherein
        the controller is configured to, at a time of turning on the dual-gate bidirectional switch and when a potential of the first source is lower than a potential of the second source, apply a first positive voltage between the first gate and the first source from the first gate drive circuit for a first period, and apply a voltage smaller than the first positive voltage after the first period has elapsed,
    the dual-gate bidirectional switch further includes:
        a substrate,
        a first nitride semiconductor layer disposed on the substrate,
        a second nitride semiconductor layer disposed on the first nitride semiconductor layer and having a bandgap larger than a bandgap of the first nitride semiconductor layer,
        a first source electrode, a first gate electrode, a second gate electrode, and a second source electrode, which are disposed on the second nitride semiconductor layer,
        a first p-type layer interposed between the first gate electrode and the second nitride semiconductor layer, and
        a second p-type layer interposed between the second gate electrode and the second nitride semiconductor layer,
    the first gate includes the first gate electrode and the first p-type layer,
    the second gate includes the second gate electrode and the second p-type layer, the first gate drive circuit includes:
   a first series circuit connected between the first gate and the first source and including:
      a positive power supply,
      a first switch,
      a capacitor, and
      a first resistor, and
   a second resistor connected in parallel to a series circuit of the capacitor and the first resistor,
the first resistor has a resistance value smaller than a resistance value of the second resistor, and
the controller controls the first switch.

2. The control system according to claim 1, wherein the controller is configured to, at the time of turning on the dual-gate bidirectional switch and when the potential of the first source is lower than the potential of the second source, apply a second positive voltage between the second gate and the second source from the second gate drive circuit for a second period, and apply a voltage smaller than the second positive voltage after the second period has elapsed.

3. The control system according to claim 2, wherein the controller is configured to, at the time of turning on the dual-gate bidirectional switch and when the potential of the second source is higher than the potential of the first source, start application of the second positive voltage between the second gate and the second source from the second gate drive circuit, and thereafter, start application of the first positive voltage within the second period between the first gate and the first source from the first gate drive circuit.

4. The control system according to claim 1, wherein the controller is configured to match, at the time of turning on the dual-gate bidirectional switch, a timing of applying the first positive voltage between the first gate and the first source from the first gate drive circuit with
   a timing of starting application of a voltage higher than a threshold voltage between the second gate and the second source from the second gate drive circuit.

5. The control system according to claim 1, wherein the controller is configured to, at the time of turning on the dual-gate bidirectional switch and when the potential of the first source is lower than the potential of the second source, start application of the first positive voltage between the first gate and the first source from the first gate drive circuit, and thereafter, start application of a voltage higher than a threshold voltage between the second gate and the second source from the second gate drive circuit within the first period.

6. The control system according to claim 1, wherein
the first gate drive circuit includes
   a second series circuit connected between the first gate and the first source and including a negative power supply, a second switch, and a third resistor.

7. The control system according to claim 1, wherein
the first gate drive circuit includes
   a second series circuit of a negative power supply and a second switch, the second series circuit being connected in parallel to the first series circuit of the positive power supply and the first switch.

8. The control system according to claim 1, wherein
the first series circuit further includes a first diode,
the first gate drive circuit further includes:
   a second series circuit of a negative power supply and a second switch, the second series circuit being connected in parallel to the first series circuit of the positive power supply and the first switch,
   a second resistor connected in parallel to the first series circuit of the first diode, the capacitor, and the first resistor, and
   a third series circuit including a second diode and a third resistor, the series circuit being connected in parallel to the first series circuit of the first diode, the capacitor, and the first resistor,
the first diode has an anode connected to a positive electrode of the positive power supply and a negative electrode of the negative power supply,
the second diode has a cathode connected to a positive electrode of the positive power supply and a negative electrode of the negative power supply, and
the third resistor has a resistance value smaller than the resistance value of the second resistor.

9. A control system for a dual-gate bidirectional switch of a normally-on type, the dual-gate bidirectional switch including a first gate, a first source corresponding to the first gate, a second gate, and a second source corresponding to the second gate, the control system comprising:
   a first gate drive circuit connected between the first gate and the first source;
   a second gate drive circuit connected between the second gate and the second source; and
   a controller that controls the first gate drive circuit and the second gate drive circuit, wherein
      the controller is configured to, at a time of turning on the dual-gate bidirectional switch and when a potential of the first source is lower than a potential of the second source, apply a first positive voltage between the first gate and the first source from the first gate drive circuit for a first period, and apply a voltage smaller than the first positive voltage after the first period has elapsed,
   the dual-gate bidirectional switch includes
      a substrate,
      a first nitride semiconductor layer disposed on the substrate,
      a second nitride semiconductor layer disposed on the first nitride semiconductor layer and having a bandgap larger than a bandgap of the first nitride semiconductor layer,
      a first source electrode, a first gate electrode, a second gate electrode, and a second source electrode, which are disposed on the second nitride semiconductor layer,
      a first p-type layer interposed between the first gate electrode and the second nitride semiconductor layer, and
      a second p-type layer interposed between the second gate electrode and the second nitride semiconductor layer,
   the first gate includes the first gate electrode and the first p-type layer,
   the second gate includes the second gate electrode and the second p-type layer,
   the first gate drive circuit includes:
      a first series circuit connected between the first gate and the first source and including:
         a negative power supply,
         a first switch,
         a capacitor, and
         a first resistor,
      a second resistor connected in parallel to a series circuit of the capacitor and the first resistor, and
      a second switch connected in parallel to a series circuit of the negative power supply and the first switch,
   the first resistor has a resistance value smaller than a resistance value of the second resistor, and the controller controls the first switch and the second switch.

10. The control system according to claim 9, wherein the first gate drive circuit includes
a third resistor connected between the first gate and the first source.

11. The control system according to claim 9, wherein the first gate drive circuit includes
the first gate drive circuit further includes a clamp circuit connected between the first gate and the first source and configured to clamp a voltage between the first gate and the first source.

12. The control system according to claim 9, wherein the first series circuit further includes a first diode, the first gate drive circuit further includes:
  a second series circuit of a second diode and a second resistor, the second series circuit being connected in parallel to the first series circuit of the first diode and the first resistor, and
  a third resistor connected in parallel to the first series circuit of the capacitor, the first diode, and the first resistor,
the first diode has an anode connected to the capacitor,
the second diode has a cathode connected to the capacitor, and
the first gate drive circuit further includes a clamp circuit connected between the first gate and the first source and configured to clamp a voltage between the first gate and the first source.

13. The control system according to claim 12, wherein the clamp circuit includes
  a Zener diode, and
  a diode, and
the Zener diode has an anode connected to the first gate,
the diode has a cathode connected to a cathode of the Zener diode, and
the diode has an anode connected to the first source.

14. The control system according to claim 13, wherein the first gate drive circuit further includes a third series circuit of a third diode and a fourth resistor, the third series circuit being connected in parallel to the first series circuit of the capacitor, the second diode, and the second resistor, and
the third diode has a cathode connected to the capacitor.

15. The control system according to claim 9, wherein the first series circuit further includes a first diode, the first gate drive circuit further includes:
  a second series circuit of a second diode and a second resistor, the series circuit being connected in parallel to the first series circuit of the first diode and the first resistor, and
  a third resistor connected in parallel to the first series circuit of the capacitor, the first diode, and the first resistor,
the first diode has an anode connected to the capacitor,
the second diode has a cathode connected to the capacitor, and
the first gate drive circuit further includes a clamp circuit connected in parallel to the first series circuit of the capacitor, the first diode, and the first resistor.

16. A control system for a unidirectional switching element having a gate, a source, and a drain, the control system comprising:
  a gate drive circuit; and
  a controller that controls the gate drive circuit, wherein
  the unidirectional switching element is a single-gate field effect transistor of a normally-on type,
  the single-gate field effect transistor includes
    a substrate,
    a first nitride semiconductor layer disposed on the substrate,
    a second nitride semiconductor layer disposed on the first nitride semiconductor layer and having a bandgap larger than a bandgap of the first nitride semiconductor layer,
    a source electrode, a gate electrode, and a drain electrode disposed on the second nitride semiconductor layer, and
    a p-type layer interposed between the gate electrode and the second nitride semiconductor layer,
  the gate includes the gate electrode and the p-type layer,
  the source includes the source electrode,
  the drain includes the drain electrode,
  the gate drive circuit is connected between the gate and the source, and
  the controller is configured to, at a time of turning on the unidirectional switching element and when a potential of the source is lower than a potential of the drain, apply a first positive voltage between the gate and the source from the gate drive circuit for a first period, and apply a voltage smaller than the first positive voltage after the first period has elapsed.

* * * * *